(12) United States Patent
Kurokawa

(10) Patent No.: US 8,293,014 B2
(45) Date of Patent: Oct. 23, 2012

(54) SUBSTRATE PROCESSING APPARATUS AND REACTION TUBE FOR PROCESSING SUBSTRATE

(75) Inventor: Harushige Kurokawa, Higashi murayama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 180 days.

(21) Appl. No.: 12/644,339

(22) Filed: Dec. 22, 2009

(65) Prior Publication Data

US 2010/0162958 A1    Jul. 1, 2010

(30) Foreign Application Priority Data

Dec. 25, 2008 (JP) .................. 2008-329923
Nov. 20, 2009 (JP) .................. 2009-264537

(51) Int. Cl.
- *C23C 16/455* (2006.01)
- *C23C 16/52* (2006.01)
- *C23F 1/00* (2006.01)
- *H01L 21/306* (2006.01)
- *C23C 16/06* (2006.01)
- *C23C 16/22* (2006.01)

(52) U.S. Cl. ........ 118/715; 118/725; 118/663; 118/695; 118/696; 156/345.33; 156/345.52

(58) Field of Classification Search ............ 118/715, 118/725, 663, 695, 696; 156/345.33, 345.52
See application file for complete search history.

(56) References Cited

U.S. PATENT DOCUMENTS

| | | | |
|---|---|---|---|
| 5,307,568 A * | 5/1994 | Matsuo et al. | 34/92 |
| 5,788,447 A | 8/1998 | Yonemitsu et al. | |
| 6,066,210 A | 5/2000 | Yonemitsu et al. | |
| 6,143,083 A | 11/2000 | Yonemitsu et al. | |
| 6,899,764 B2 * | 5/2005 | Frijlink | 118/719 |
| 2002/0023919 A1 * | 2/2002 | Toya et al. | 219/544 |
| 2006/0166516 A1 | 7/2006 | Yamauchi et al. | |
| 2008/0236744 A1 * | 10/2008 | Furuse et al. | 156/345.1 |
| 2009/0311807 A1 * | 12/2009 | Yamaga et al. | 438/5 |
| 2010/0151194 A1 * | 6/2010 | D'Evelyn | 428/141 |
| 2010/0162958 A1 * | 7/2010 | Kurokawa | 118/725 |
| 2010/0184251 A1 * | 7/2010 | Aslami et al. | 438/73 |
| 2010/0215562 A1 * | 8/2010 | Sanchez et al. | 423/349 |
| 2011/0027160 A1 * | 2/2011 | Sanchez et al. | 423/349 |

FOREIGN PATENT DOCUMENTS

| | | |
|---|---|---|
| JP | 3150620 | 1/2001 |
| JP | 2006-124831 | 5/2006 |
| JP | 2006-203038 | 8/2006 |

* cited by examiner

*Primary Examiner* — Rudy Zervigon
(74) *Attorney, Agent, or Firm* — Brundidge & Stanger, P.C.

(57) ABSTRACT

There are provided a substrate processing apparatus and a reaction tube for processing a substrate. The substrate processing apparatus comprises a process chamber configured to accommodate a substrate and process the substrate, a heater configured to heat the substrate, a gas supply part configured to supply a gas to an inside of the process chamber, a quartz reaction tube installed in the alloy reaction tube and a purge gas supply part configured to supply a purge gas to a gap formed between the alloy reaction tube and the quartz reaction tube. The process chamber comprises an alloy reaction tube made of a material comprising at least molybdenum (Mo) and cobalt (Co) and excluding aluminum (Al).

7 Claims, 11 Drawing Sheets

SUBSTRATE PROCESSING APPARATUS AND REACTION TUBE FOR PROCESSING SUBSTRATE

CROSS-REFERENCE TO RELATED PATENT APPLICATION

This U.S. non-provisional patent application claims priority under 35 U.S.C. §119 of Japanese Patent Application Nos. 2008-329923, filed on Dec. 25, 2008, and 2009-264537, filed on Nov. 20, 2009, in the Japanese Patent Office, the entire contents of which are hereby incorporated by reference.

BACKGROUND OF THE INVENTION

1. Field of the Invention

The present invention relates to a substrate processing apparatus for forming a film on a semiconductor substrate, and more particularly, to a substrate processing apparatus for forming a silicon film on a semiconductor substrate to form a solar battery, and a reaction tube for processing a substrate.

2. Description of the Prior Art

Recently, development of alternative energy sources that can replace fossil fuels becomes more important from the point of view of environmental protection, and in the field of solar energy generation which is considered as one of such alternative energy sources, development of low-cost, high-efficiency solar batteries is being accelerated.

In one of solar battery manufacturing processes, a silicon film is formed on a silicon substrate, and as examples of apparatuses configured to form such silicon films, there are a pancake type epitaxial growth apparatus that employs a high-frequency heating method, a barrel type epitaxial growth apparatus, a barrel type epitaxial growth apparatus employing a lamp heating method, and a single wafer type epitaxial growth apparatus.

Such apparatuses are required to perform an epitaxial growth process in a reaction tube at a low pressure state such as a vacuum state and a high temperature state, and thus the reaction tube should have at least good pressure resistance and high temperature resistance. Furthermore, in the case of using a dangerous gas such as $H_2$ gas, a structure having strong internal durability and made of a high-quality material is required to prevent leakage of gas. These requirements increase manufacturing costs of such apparatuses but reduce cost performances of the apparatuses.

Moreover, in the case where a reaction tube is made of quartz and silicon is epitaxially grown in the reaction tube at a low pressure and a temperature of 1000° C. or higher, since the possibility of thermal degradation of the quartz reaction tube is increased, it is preferable that a cooling mechanism be installed at the quartz reaction tube to ensure safety. However, although a cooling mechanism can be simply installed, it is impossible to prevent thermal degradation of the quartz reaction tube completely, and epitaxial substrate processing apparatuses using such quartz reaction tubes having high pressure resistance are expensive. As apparatuses equipped with cooling mechanisms, there already exist a pancake type high-frequency induction heating apparatus on the top of which a water-cooled stainless bell jar is installed, and a lamp heating type epitaxial apparatus in which a quartz bell jar is cooled by a powerful air cooling mechanism. However, since such apparatuses use heating sources having short lifespan such as a high frequency generator or a lamp heating source, there arises a problem of low productivity.

Furthermore, in the case of using monosilane ($SiH_4$) source gas that easily undergoes thermal decomposition, since hot-wall type processing is necessary, a cooling mechanism may not be installed, and moreover, silicon generated by decomposition of the monosilane source gas may easily be attached and deposited onto the inner wall of a reaction tube as well as the surface of a wafer. In the case where a reaction tube is made of quartz, due to the difference between thermal expansion coefficients of a silicon film and the reaction tube, the silicon film may be cracked or stripped to cause, for example, devitrification of the reaction tube, and thus the inner wall of the reaction tube may be seriously damaged and weakened. Therefore, it has been difficult to use such a reaction tube as a production apparatus due to safety concerns. In addition, silicon stripped from the inner wall of a reaction tube contaminates substrates.

In addition, an amorphous silicon film can be formed as a film for an inexpensive solar battery. Therefore, recently, inexpensive large-diameter glass substrates are used for forming thin films of solar batteries, and methods of forming amorphous silicon thin films (which can be formed relatively at a low temperature) on such glass substrates are widely used. However, the use of amorphous silicon thin films results in low solar energy conversion efficiency and limited application fields.

On the other hand, in the case of using single-crystalline and polycrystalline silicon films grown on silicon substrates, the energy conversion efficiency of solar batteries can be increased by a factor of 3 as compared with the case of using amorphous silicon film formed on glass substrates. In addition, the aging variations of the solar batteries may be reduced, and the lifespan of the solar batteries may be increased.

Therefore, if costs of a substrate processing apparatus can be reduced, a solar battery can have many merits in the case of using a silicon epitaxial film formed on a silicon substrate as a single-crystalline silicon film.

In addition, since silicon is the most abundant element on earth, if there is sufficient purification equipment, the costs of power generation with solar batteries may be reduced to levels competitive with the costs of power generation using fossil fuels such as petroleum oil.

SUMMARY OF THE INVENTION

Objects of the present invention are to perform a film-forming process at a higher temperature, reduce the manufacturing costs of a substrate processing apparatus, and form a silicon film for a solar battery with low costs or high efficiency.

According to an aspect of the present invention, there is provided a substrate processing apparatus comprising: a process chamber configured to accommodate a substrate and process the substrate, the process chamber comprising an alloy reaction tube made of a material comprising at least molybdenum (Mo) and cobalt (Co) and excluding aluminum (Al); a heater configured to heat the substrate; and a gas supply part configured to supply a gas to an inside of the process chamber; a quartz reaction tube installed in the alloy reaction tube; and a purge gas supply part configured to supply a purge gas to a gap formed between the alloy reaction tube and the quartz reaction tube.

According to another aspect of the present invention, there is provided a reaction tube for processing a substrate, wherein the reaction tube constitutes a process chamber configured to accommodate and process the substrate and is covered with a heater configured to heat the substrate, and the reaction tube is configured such that gas is supplied to an inside of the process chamber, the reaction tube comprising a material containing molybdenum (Mo) and cobalt (Co) but not containing aluminum (Al).

DETAILED DESCRIPTION OF THE PREFERRED EMBODIMENTS

Embodiments of the present invention will be described hereinafter with reference to the attached drawings.

Figure 1:
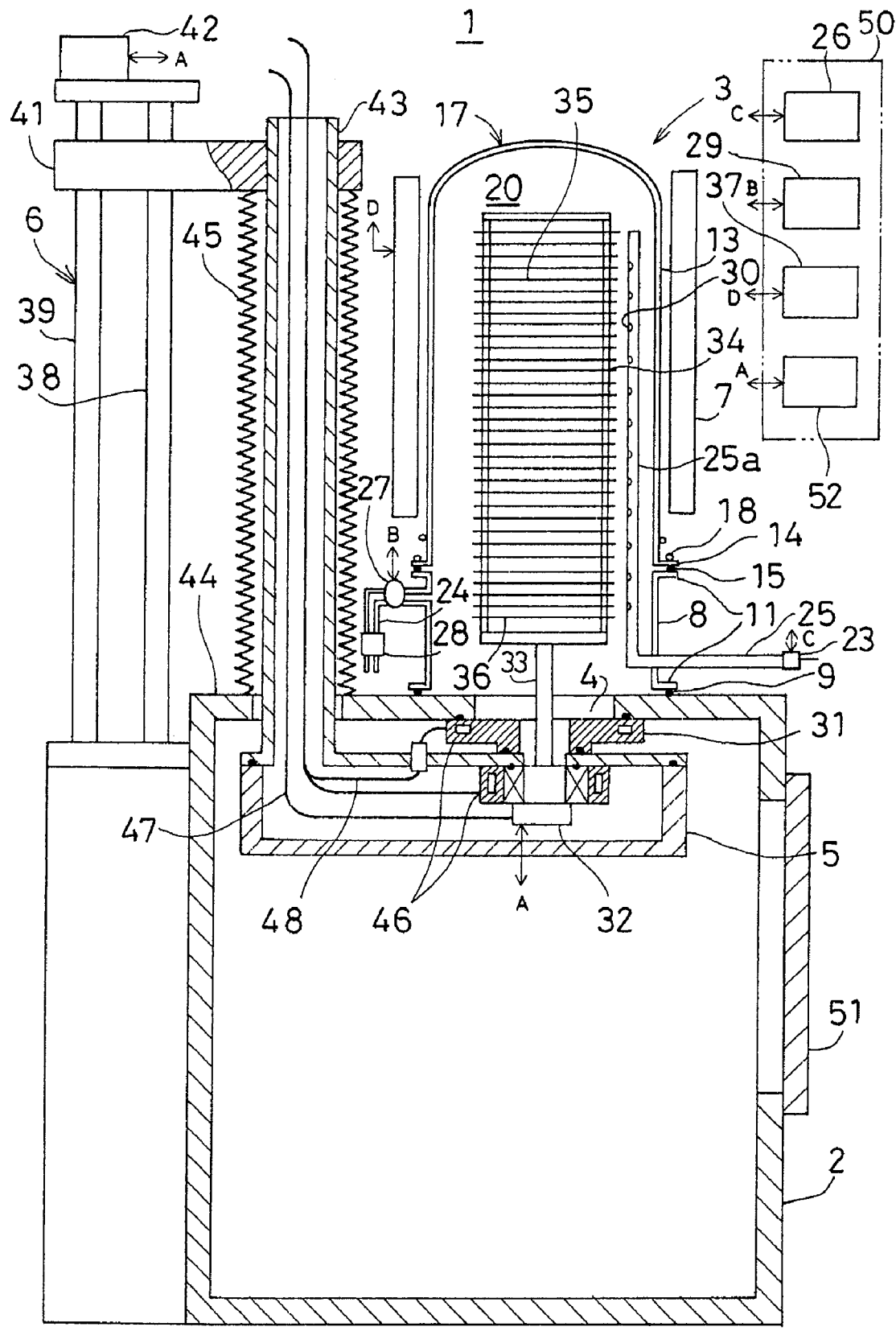
FIG. 1 is a schematic sectional elevation view for illustrating a first embodiment of the present invention.

First, a first embodiment will be described with reference to FIG. 1. In the following description, a batch type substrate processing apparatus including a vertical furnace will be described as an example of a substrate processing apparatus 1, and substrates to be processed are wafers.

A process furnace 3 is erected on an airtight preliminary chamber 2, and the preliminary chamber 2 communicates with a process furnace 3 through a furnace port 4. An elevator unit 5 is accommodated in the preliminary chamber 2, and the elevator unit 5 is configured to be moved upward and downward by an elevating mechanism such as a boat elevator 6.

First, the process furnace 3 will be described.

At the upper side of the preliminary chamber 2, a heater 7 is installed concentrically with the furnace port 4 as a heating mechanism. The heater 7 has a cylindrical shape and is configured by a heater wire and a insulating material disposed around the heater wire. The heater 7 is vertically installed in a state where the heater 7 is supported by a holder (not shown).

A manifold 8 made of a metal is erected on the preliminary chamber 2 concentrically with the furnace port 4. Flanges 11 are formed on the upper and lower sides of the manifold 8, and the manifold 8 is hermetically fixed to the top surface of the preliminary chamber 2 with a seal member such as an O-ring 9 being disposed therebetween.

On the upper flange 11 of the manifold 8, an alloy reaction tube 13 having a cylindrical shape and made of an alloy is erected coaxially with the manifold 8. The alloy reaction tube 13 erected on the upper flange 11 has a cylindrical shape with an opened side.

At the lower side of the alloy reaction tube 13, a reaction tube flange 14 is formed, and between the reaction tube flange 14 and the upper flange 11 of the manifold 8, a seal member such as an O-ring 15 is disposed.

The heater 7 and the alloy reaction tube 13 are disposed in a concentric multiple circle shape. The manifold 8 and the alloy reaction tube 13 define a reaction space 20, and the alloy reaction tube 13 constitutes a process chamber 17.

The alloy reaction tube 13 is made of a heat-resistant and corrosion-resistant alloy. For example, the alloy reaction tube 13 may be made of a material such as Inconel (registered trademark), Hastelloy (registered trademark), and UMCo50 (registered trademark of Mitsubishi Materials). However, the inventor has found out the following fact: if the alloy reaction tube 13 is made of only such a material, since such a material includes aluminum (Al), aluminum nitride (AlN) is produced by reaction between aluminum and nitrogen when the temperature of the alloy reaction tube 13 is increased to 1150° C. or higher in a state a nitrogen-containing gas such as nitrogen gas is filled in the alloy reaction tube 13. In addition, the inventor has also found out that the alloy reaction tube 13 may be damaged or deteriorated due to the generation of aluminum nitride.

Therefore, to prevent such problems, the alloy reaction tube 13 is made of a material not including aluminum (Al). In addition, so as to make the alloy reaction tube 13 endure at least at 1100° C., the alloy reaction tube 13 is made of a material including molybdenum (Mo) and cobalt (Co). That is, the alloy reaction tube 13 is made of a material not including aluminum (Al) but including molybdenum (Mo) and cobalt (Co). In addition, preferably, the alloy reaction tube 13 may be formed of a material not including copper (Cu) which causes copper contamination, but including tungsten (W) for improving heat resistant characteristics; that is, the alloy reaction tube 13 may be of a material not including Al and Cu but including Mo, Co, and W.

For example, the alloy reaction tube 13 may be formed of Inco HX (registered trademark) or Hastelloy X (registered trademark). Such a material includes 47.5% of nickel (Ni), 21.8% of chromium (Cr), 9.0% of molybdenum (Mo), 18.5% of iron (Fe), 1.5% of cobalt (Co), and 0.6% of tungsten (W). Inconel is a nickel base alloy including nickel (Ni) as a main component, and UMCo50 includes chromium (Cr), iron (Fe), cobalt (Co), and other components. UMCo50 can be used at 1350° C.

Inco HX is a solid-solution strengthening type heat-resistant alloy which maintains its strength and acid-resistance up to 1200° C., and after solution heat treatment, Inco HX has high strength and good workability.

In addition, if the reaction tube 13 forming the reaction space 20 is made of an alloy such as Inconel, a thin film (for example, TiC polycrystalline film) can be formed in the process chamber 17 at about 1000° C. under a hydrogen atmosphere. The inventor has observed this through an experiment.

A cooling conduit 18 is fixedly disposed around the entire circumferences of the lower end-part of the alloy reaction tube 13 and the reaction tube flange 14 by a method such as welding, and a cooling medium such as wafer supplied from a cooling medium supply device is circulated through the cooling conduit 18 so as to cool the O-ring 15.

A gas exhaust pipe 24 is installed at the manifold 8, and a gas supply pipe 25 is installed through the manifold 8. The gas supply pipe 25 includes a nozzle part 25a extending upward along the inner surface of the process chamber 17, and gas injection holes 30 are bored at predetermined intervals. In addition, the lower part of the gas supply pipe 25 penetrates the manifold 8 horizontally and branches into a plurality of parts at an upstream side, and gas supply sources (not shown) are connected to the branch parts through valves (not shown) and gas flowrate control devices such as a mass flow controller (MFC) 23.

For example, the gas supply pipe 25 may be formed by an external gas supply pipe (not shown) installed at the outer wall of the manifold 8, and a nozzle part 25a fitted into the external gas supply pipe from the inner wall of the manifold 8.

A gas flowrate control unit 26 is electrically connected to the valve and the MFC 23 so that gas can be supplied at a desired flowrate by controlling the MFC 23 and the valve at a desire time.

In the downstream side of the gas exhaust pipe 24, gas may be pushed at about atmosphere pressure toward an exhaust gas processing chamber by exhaustion momentum. However, alternatively, a vacuum exhaust device 28 such as a vacuum pump may be connected to the downstream side of the gas exhaust pipe 24 through a pressure detector such as a pressure sensor (not shown) and a pressure regulator such as an automatic pressure control (APC) valve 27. A pressure control unit 29 is electrically connected to the pressure sensor and the APC valve 27, and the pressure control unit 29 is configured to adjust the inside pressure of the process chamber 17 to a desired level at a desired time by controlling the opened area of the APC valve 27 based on pressure information detected by the pressure sensor.

At the lower side of the furnace port 4, the elevator unit 5 is disposed, and at the top surface of the elevator unit 5, a seal cap 31 is installed as a furnace cover for hermetically closing the furnace port 4.

The seal cap 31 is made of a material such as stainless steel and has a disk shape. At the top surface of the seal cap 31, an O-ring is installed as a seal member for hermetically sealing the furnace port 4.

The elevator unit 5 has an airtight hollow structure, and a rotary mechanism 32 is installed in the elevator unit 5. A rotation shaft 33 of the rotary mechanism 32 protrudes upward through the top side of the elevator unit 5 and the seal cap 31, and it is configured such that a boat 34 (described later) can be supported on the upper end of the rotation shaft 33. Therefore, by operating the rotary mechanism 32, the boat 34 can be rotated through the rotation shaft 33, and substrates (wafers) 35 can be rotated through the boat 34.

The boat 34 is a substrate holder configured to hold wafers 35 in a manner such that the wafers 35 are horizontally positioned and arranged in multiple stages with the centers of the wafers 35 being aligned with each other. The boat 34 is made of a heat-resistant material such as quartz or silicon carbide and is configured to hold a plurality of wafers 35 horizontally in multiple stages. At the lower part of the boat 34, insulating members such as disk-shaped insulating plates 36 made of a heat-resistant material such as quartz or silicon carbide are oriented horizontally and arranged in multiple stages so as to prevent heat transfer from the heater 7 to the manifold 8.

Near the heater 7, a temperature sensor (not shown) is installed as a temperature detector configured to detect the inside temperature of the process chamber 17. A temperature control unit 37 is electrically connected to the heater 7 and the temperature sensor, and based on temperature information detected by the temperature sensor, the temperature control unit 37 controls power supplied to the heater 7 so as to obtain desired temperature distribution in the process chamber 17 at a desired time.

Next, the boat elevator 6 will be described.

The boat elevator 6 is installed at a side of the preliminary chamber 2.

The boat elevator 6 includes a guide shaft 38 and a ball screw 39 that extend upward, and an elevator base 41 is slidably fitted to the guide shaft 38 and screw-coupled to the ball screw 39 while allow rotation of the ball screw 39. An elevator motor 42 is connected to the upper end of the ball screw 39 so that the ball screw 39 can be rotated by operating the elevator motor 42.

At the elevator base 41, a hollow elevator shaft 43 is installed to be extended from the elevator base 41, and a joint part between the elevator base 41 and the elevator shaft 43 is hermetically sealed. The elevator shaft 43 is configured to be moved upward and downward together with the elevator base 41. The elevator shaft 43 is movably inserted through a top plate 44 of the preliminary chamber 2, and a penetration hole of the top plate 44 through which the elevator shaft 43 is inserted is sufficiently large such that the elevator shaft 43 can be prevented from making contact with the top plate 44.

Between the preliminary chamber 2 and the elevator base 41, a bellows 45 is installed around the elevator shaft 43 as a hollow flexible part so as to seal the preliminary chamber 2 hermetically. The bellows 45 can be sufficiently expanded and contracted in accordance with lifting motions of the elevator base 41, and the bellows 45 has an inner diameter sufficiently greater than the outer diameter of the elevator shaft 43 so as not to make contact with the elevator shaft 43 during expansion or contraction.

The elevator unit 5 is horizontally fixed to the lower end of the elevator shaft 43. As described above, the rotary mechanism 32 is installed in the elevator unit 5, and the inside of the elevator unit 5 is isolated from the inside atmosphere of the preliminary chamber 2. The periphery of the rotary mechanism 32 and a sealing part of the seal cap 31 are cooled by a cooling mechanism 46.

Power cables 47 are connected from the upper end of the elevator shaft 43 to the rotary mechanism 32 through the hollow inside of the elevator shaft 43. Coolant conduits 48 are connected to the cooling mechanism 46 so as to supply a coolant to the cooling mechanism 46. The coolant conduits 48 extend through the hollow inside of the elevator shaft 43 from the upper end of the elevator shaft 43.

As the ball screw 39 rotates upon the operation of the elevator motor 42, the elevator unit 5 is moved upward and downward together with the elevator base 41 and the elevator shaft 43.

As the elevator unit 5 is moved upward, the furnace port 4 is closed by the seal cap 31, and in this state, wafer processing is possible. By lowering the elevator unit 5, both the seal cap 31 and the boat 34 can be moved downward to place the boat 34 in the preliminary chamber 2.

The preliminary chamber 2 will now be described. The preliminary chamber 2 is airtight, and a purge gas supply line (not shown) and an exhaust line (not shown) are connected to the preliminary chamber 2. By supplying inert gas such as nitrogen ($N_2$) gas to the inside of the preliminary chamber 2 and exhausting the inert gas from the inside of the preliminary chamber 2, the inside of the preliminary chamber 2 can be purged by inert gas, and an inert gas atmosphere can be formed in the preliminary chamber 2. However, instead of forming the preliminary chamber 2 into the above-described airtight structure, a simply exhaust duct may be installed in the vicinity of the furnace port 4 so as to prevent the inside of the process chamber 17 from being filled with $N_2$ gas flown into the process chamber 17, and by this, manufacturing costs of the substrate processing apparatus 1 can be reduced.

At a side of the preliminary chamber 2, a gate valve 51 is installed, and in a state where the boat 34 is moved downward, the gate valve 51 can be opened to charge wafers 35 to the boat 34 or discharge wafers 35 from the boat 34 by using a substrate carrying mechanism (not shown). As described above, if the preliminary chamber 2 has a simple structure, since only a boat transfer mechanism is necessary but the gate valve 51 is not necessary, costs can be decreased. In addition, it is preferable that the preliminary chamber 2 be cooled by using cooling air or water so as to prevent overheating of the preliminary chamber 2.

A driving control unit 52 is electrically connected to the substrate carrying mechanism, the elevator motor 42, and the rotary mechanism 32 so as to perform desired operations at desired times.

The gas flowrate control unit 26, the pressure control unit 29, the temperature control unit 37, and the driving control unit 52 constitute a manipulation unit and an input/output unit, and are electrically connected to a min control unit (not shown) that controls the overall operation of the substrate processing apparatus 1. The gas flowrate control unit 26, the pressure control unit 29, the temperature control unit 37, and the driving control unit 52 are configured as a controller 50.

Next, formation of an epitaxial film using the substrate processing apparatus 1 will be described.

In the following description, each part of the substrate processing apparatus 1 is controlled by the controller 50.

After a predetermined number of wafers 35 are charged into the boat 34 by the substrate carrying mechanism (not shown) in a state where the boat 34 is moved downward, the gate valve 51 is closed, and the inside of the preliminary chamber 2 is purged with inert gas such as $N_2$ gas.

The elevator unit 5 is lifted by the boat elevator 6, and the boat 34 is loaded into the process chamber 17. After the boat 34 is completely loaded into the process chamber 17, the furnace port 4 is hermetically sealed by the seal cap 31.

The inside pressure of the process chamber 17 is adjusted to a desired level by the vacuum exhaust device 28. At this time, the inside pressure of the process chamber 17 is measured by the pressure sensor, and based on the measured pressure, the APC valve 27 is feedback-controlled so that the inside pressure of the process chamber 17 can be kept at the desired level. In order to increase the rate of film growth, it is preferable that the inside of the process chamber 17 be decompressed to a pressure close to normal or atmospheric pressure.

In addition, the inside of the process chamber 17 is heated to a desired temperature and kept at that temperature by the heater 7, for example, in the range from 1000° C. to 1200° C. The alloy reaction tube 13 is made of a heat-resistant and corrosion-resistant alloy for performing a high-temperature substrate processing process. Particularly, since the alloy reaction tube 13 is made of a material not including aluminum (Al) but including molybdenum (Mo) and cobalt (Co), aluminum nitride is not formed on the alloy reaction tube 13, and thus the alloy reaction tube 13 can be prevented from being damaged or deteriorated.

Furthermore, so as to obtain desired temperature distribution in the process chamber 17 in a heated state, power supplied to the heater 7 is feedback-controlled based on temperature information detected by the temperature sensor (not shown).

Subsequently, the rotary mechanism 32 rotates the boat 34 to rotate the wafers 35.

A process gas for forming a silicon film is introduced from the gas supply pipe 25 into the inside of the process chamber 17 through the nozzle part 25a while controlling the flowrate of the process gas. Since the gas injection holes 30 of the nozzle part 25a are vertically arranged at predetermined intervals, the process gas can be distributed into the process chamber 17 with a uniform concentration.

While the process gas flows through the process chamber 17, the process gas makes contact with the wafers 35 so that silicon (Si) films can be deposited on the surfaces of the wafers 35.

Since films are formed at a high temperature (for example, 1000° C. or higher) and a decompressed pressure close to normal or atmospheric pressure, the films are rapidly grown to improve the productivity.

After a preset time, inert gas is supplied from an inert gas supply source (not shown) to replace the inside atmosphere of the process chamber 17 with the inert gas and return the inside pressure of the process chamber 17 to atmospheric pressure.

Thereafter, the elevator unit 5 is moved downward by the boat elevator 6, and as the furnace port 4 is opened, the processed wafers 35 are taken down to the preliminary chamber 2 in a state where the wafers 35 are held in the boat 34.

After the processed wafers 35 are cooled to a predetermined temperature in the preliminary chamber 2, the gate valve 51 is opened, and the processed wafers 35 are discharged from the boat 34 by the substrate carrying mechanism (not shown).

After all the processed wafers 35 are discharged from the boat 34, non-processed wafers 35 are charged into the boat 34, and batch processing of the wafers 35 is repeated.

As described above, according to the present invention, silicon films can be epitaxially grown on silicon wafers by using an inexpensive substrate processing apparatus, and thus single-crystalline and polycrystalline thin films can be formed with low costs to manufacture solar-battery semiconductor devices, thereby making it possible to manufacture high-efficiency, long-lifespan, and inexpensive solar batteries.

Figure 2:
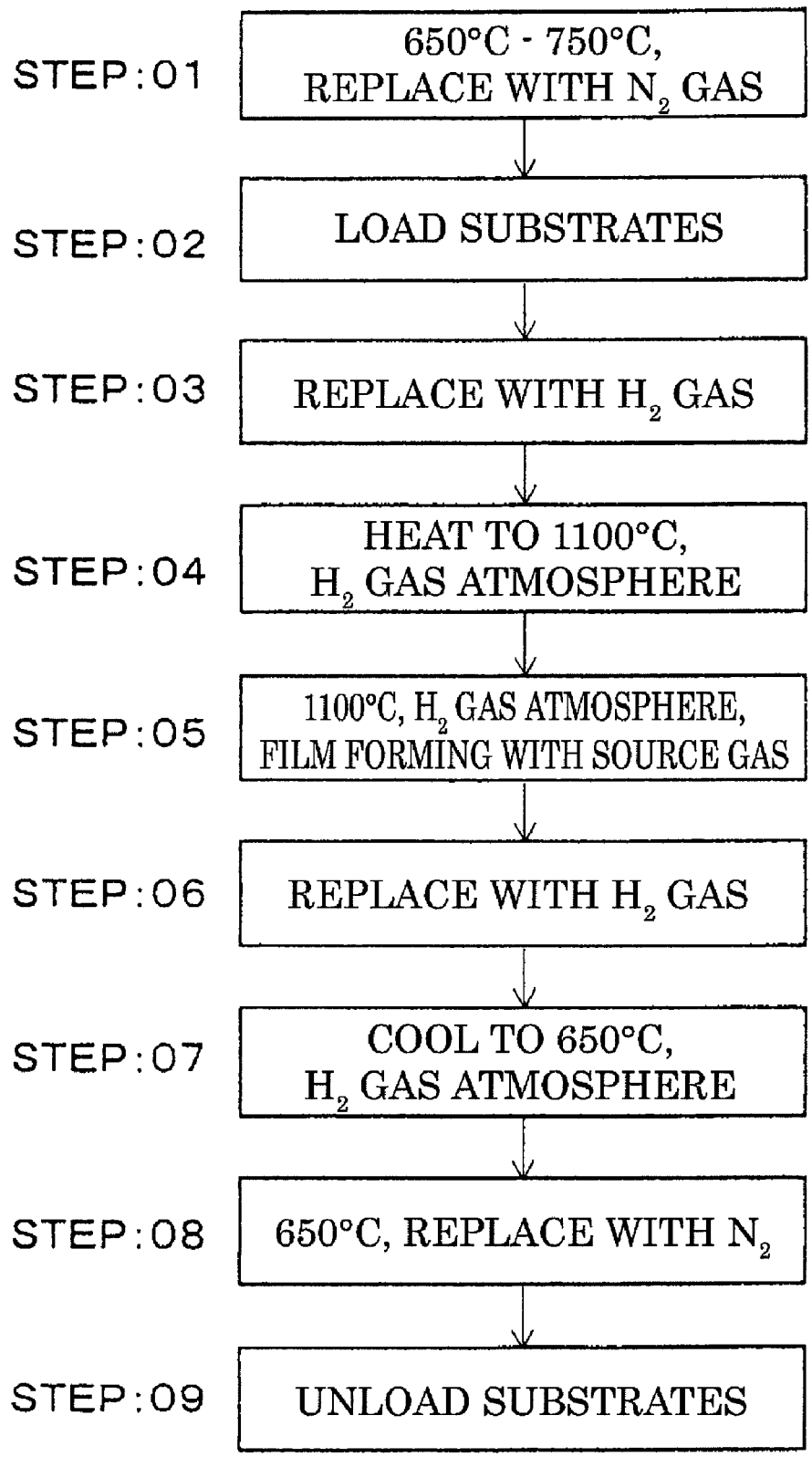
FIG. 2 is a flow chart for illustrating the first embodiment of the present invention.
Figure 3:
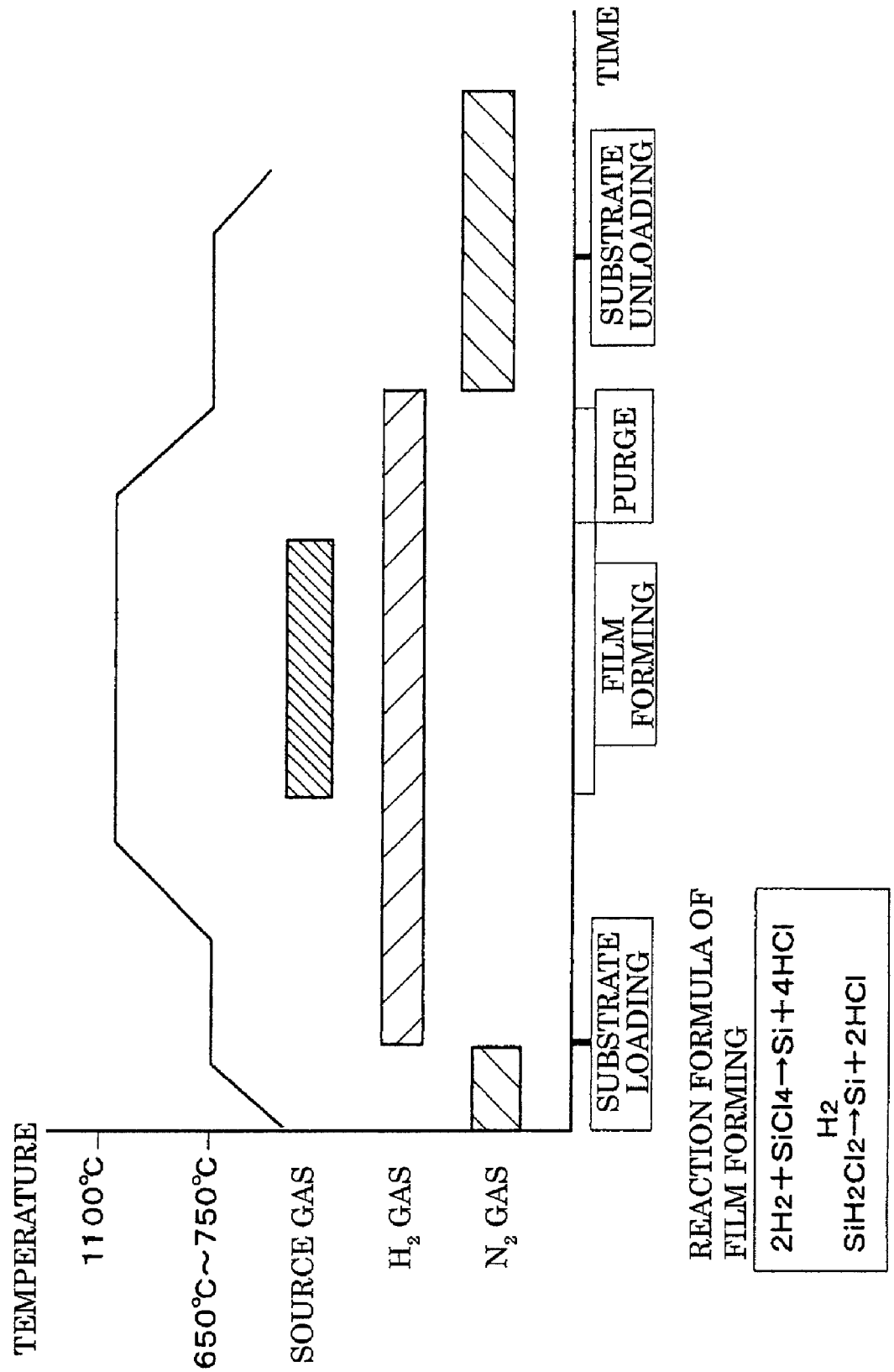
FIG. 3 is a process timing chart for illustrating the first embodiment of the present invention.

Next, with reference to FIG. 1 to FIG. 3, an exemplary substrate processing method of the present invention will be described.

The boat 34 is moved downward into the preliminary chamber 2, and the furnace port 4 is closed by a furnace port gate valve (not shown). The gate valve 51 is opened, and wafers 35 are charged into the boat 34 by the substrate carrying mechanism (not shown). The gate valve 51 is closed, and the inside of the preliminary chamber 2 is purged with nitrogen gas.

The inside of the alloy reaction tube 13 (the process chamber 17) is heated by the heater in the range from 650° C. to 750° C., and the inside atmosphere of the process chamber 17 is replaced with nitrogen gas. The inside of the process chamber 17 and the inside of the preliminary chamber 2 are kept at the same temperature (STEP: 01).

The furnace port 4 is opened by moving the furnace port gate valve, and the elevator unit 5 is lifted by the boat elevator 6 so as to load the boat 34 into the process chamber 17. When the boat 34 is completely loaded, the furnace port 4 is hermetically closed by the seal cap 31 (STEP: 02).

The inside of the process chamber 17 is purged with hydrogen ($H_2$) gas so as to replace the inside atmosphere of the process chamber 17 with the hydrogen ($H_2$) gas (STEP: 03), and thereafter, the inside of the process chamber 17 is heated to an epitaxial growth temperature of about 1100° C. (STEP: 04).

After the inside temperature of the process chamber 17 is increased to a predetermined level, in the state of $H_2$ gas atmosphere, a source gas such as silicon tetrachloride ($SiCl_4$) gas or dichlorosilane ($SiH_2Cl_2$) gas is introduced from a gas system by using $H_2$ gas as a carrier gas. In addition, a doping gas such as phosphine ($PH_3$) gas or diborane ($B_2H_6$) gas may be used (STEP: 05). If selective growth is preferred, chlorine (Cl)-containing gas having etching effects, such as dichlorosilane ($SiH_2Cl_2$) gas, may be further supplied.

Dichlorosilane gas may be preferable as a source gas because of high growth rate; however, silicon tetrachloride gas may be more preferable in terms of economics. Alternatively, trichlorosilane ($SiHCl_3$) gas may be used because of high growth rate and relatively low price although the trichlorosilane ($SiHCl_3$) gas is somewhat difficult to handle. In addition, so as to control resistivity, a doping gas such as phosphine ($PH_3$) gas, diborane ($B_2H_6$) gas, or boron trichloride ($BCl_3$)gas may be used.

After a predetermined growth time, the inside of the process chamber 17 is purged with $H_2$ gas so as to replace the inside atmosphere of the process chamber 17 with $H_2$ gas and form an $H_2$ gas atmosphere in the process chamber 17 (STEP: 06). Under the $H_2$ gas atmosphere, temperature is reduced to about 650° C. at which silicon surfaces of the wafers 35 are not nitrided (STEP: 07). Thereafter, an $N_2$ gas atmosphere is formed in the process chamber 17 (STEP: 08), and the boat 34 is taken down from the process chamber 17 by moving the elevator unit 5 through the boat elevator 6. The furnace port 4 is closed by the furnace port gate valve, and after cooling the wafers 35 processed at a predetermined temperature, the gate valve 51 is opened to discharge the processed wafers 35 by using the substrate carrying mechanism (not shown) (STEP: 09). The wafers 35 are discharged from the boat 34 in the above described order.

Figure 4:
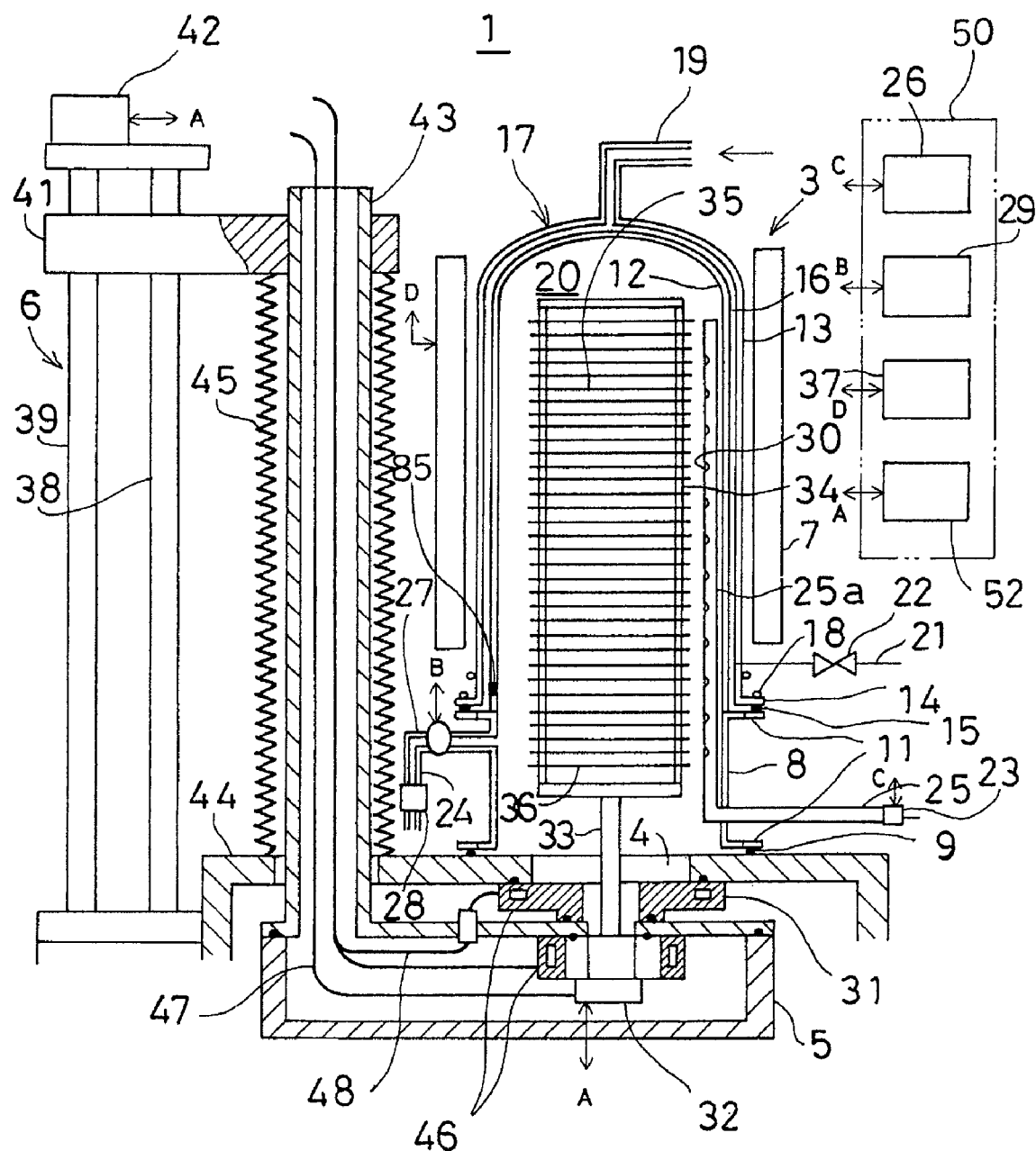
FIG. 4 is a schematic sectional elevation view illustrating main parts according to a second embodiment of the present invention.

A second embodiment of the present invention will now be described with reference to FIG. 4.

In the first embodiment of the present invention, the process chamber 17 is constituted by the alloy reaction tube 13; however, in the second embodiment of the present invention, a process chamber 17 is constituted by an alloy reaction tube 13 and an inner reaction tube 12 made of quartz and installed in the alloy reaction tube 13. Other structures than the process chamber 17 will not be described again because they are the same as those of the first embodiment.

The inner reaction tube 12 having a cylindrical shape with an opened side is erected on an upper flange 11 of a manifold 8, and the alloy reaction tube 13 which accommodates the inner reaction tube 12 and has a cylindrical shape with an opened side is erected on the upper flange 11 concentrically with the inner reaction tube 12.

A heater 7, the alloy reaction tube 13, and the inner reaction tube 12 are disposed in a concentric multiple circular shape, and a cylindrical gap 16 is formed between the alloy reaction tube 13 and the inner reaction tube 12.

The inner reaction tube 12 defines a reaction space 20, and the manifold 8, the inner reaction tube 12, and the alloy reaction tube 13 constitutes the process chamber 17.

The inner reaction tube 12 is made of quartz ($SiO_2$), and the alloy reaction tube 13 is made of the same material as that used for making the alloy reaction tube 13 of the first embodiment.

A purge gas supply pipe 19 is connected to the upper end of the alloy reaction tube 13 in a manner such that the purge gas supply pipe 19 can communicate with the gap 16, and a purge gas supply source (not shown) is connected to the purge gas supply pipe 19 so as to supply inert gas such as nitrogen gas or reducing gas such as hydrogen gas to the gap 16. A purge gas discharge pipe 21 is connected to the lower end part of the alloy reaction tube 13 in a manner such that the purge gas discharge pipe 21 can communicate with the gap 16, and an exhaust device (not shown) is connected to the purge gas discharge pipe 21 so as to discharge purge gas from the gap 16. In addition, reference numeral 22 denotes an air valve installed at the purge gas discharge pipe 21.

Owning to the inner reaction tube 12 installed in the alloy reaction tube 13, a film-forming process can be performed with higher quality.

The reason of installing the inner reaction tube 12 is as follows. In the case of silicon epitaxial growth that requires execution of purity control at a predetermined level or higher, it is required that the purity of a process reaction gas or the purity of a material of a reaction tube should be very high. In addition, so as to give a predetermined resistance to a film formed by silicon epitaxial growth, introduction of a doping gas is necessary, and at this time, it is necessary to control the amount of dopant in the film. When these requirements are considered, at least ppb-level purity control is necessary.

Therefore, generation of impurities from the alloy reaction tube 13 should be suppressed. To prevent contamination of wafers 35 by impurities emitted from a heat-resistant alloy reaction tube such as Inconel, a method of directly coating the inner surface of the alloy reaction tube 13 with silicon or a silicon compound can be considered; however, it is difficult to execute purity control at a ppb level in the compound coating method. Thus, the inner reaction tube 12 made of quartz is installed so as to prevent the inner surface of the alloy reaction tube 13 from being directly exposed to the reaction space 20.

In addition, since the alloy reaction tube 13 is an airtight vessel made of a high-strength material, an airtight structure is not necessary between the inner reaction tube 12 and the manifold 8, and an external force such as an external pressure is not applied to the inner reaction tube 12. Therefore, it is unnecessary to fabricate the inner reaction tube 12 with high precision, and the strength of the inner reaction tube 12 is not required to be high. That is, the inner reaction tube 12 can be fabricated with lower costs.

Since an airtight structure is not provided between the inner reaction tube 12 and the manifold 8, the gap 16 and the process chamber 17 communicate with each other through a region between the inner reaction tube 12 and the manifold 8. Thus, the gap 16 is purged with nitrogen gas or hydrogen gas to prevent permeation of a process gas from the inside of the process chamber 17 to the inside of the gap 16. In addition, by maintaining the gap 16 in a highly clean state, contamination of wafers 35 can be prevented. Moreover, by creating a flow of cooling gas in the gap 16, the process chamber 17 can be rapidly cooled.

In addition, since the gap 16 and the process chamber 17 communicate with each other through a region between the inner reaction tube 12 and the manifold 8, it is uncertain how much nitrogen gas or hydrogen gas flowing in the gap 16 permeates into the process chamber 17 through which position of the circumferential region between the inner reaction tube 12 and the manifold 8, and this uncertainty may increase as temperature varies, for example, due to thermal expansion of the inner reaction tube 12 according to temperature, thereby increasing the possibility of bad influence on uniform film growth of substrates. Therefore, preferably, an introduction hole 85 is formed in a lower side of the inner reaction tube 12 to induce permeation of gas through the introduction hole 85 for determining a gas permeation path previously, and in this case, films can be grown on substrates in consideration of gas permeation. Preferably, the introduction hole 85 may be formed at a position lower than a region where substrates are placed on the boat 34 in the process chamber 17, and in this case, gas permeating into the process chamber 17 through the introduction hole 85 can be exhausted through a gas exhaust pipe 24 before the gas reaches the substrates placed on the boat 34 inside the process chamber 17, so that contamination of the substrates or attachment of particles to the substrates can be prevented.

More preferably, the introduction hole 85 may be formed at a position of the circumference of the inner reaction tube 12 close to the gas exhaust pipe 24 (at a position immediately above or under the gas exhaust pipe 24), and in this case, gas permeating into the process chamber 17 through the introduction hole 85 can be exhausted through the gas exhaust pipe 24 more surely before the gas reaches the substrates placed on the boat 34 inside the process chamber 17, so that contamination of the substrates or attachment of particles to the substrates can be prevented more certainly.

In addition, preferably, the controller 50 controls purge of the gap 16 in a manner such that nitrogen gas or hydrogen gas flows into the gap 16 for purging the gap 16 in a state where the pressure of the gap 16 is greater than the pressure of the process chamber 17, and in this case, permeation of a process gas from the inside of the process chamber 17 can be prevented more surely.

Furthermore, preferably, the controller 50 may control purge of the gap 16 as follows. When the temperature of the process chamber 17 is low, for example, at 650° C. or lower, the gap 16 may be purged with nitrogen gas, and when the temperature of the process chamber 17 is high, for example, at 650° C. or higher, the gap 16 may be purged with hydrogen gas. In this case, formation of aluminum nitride (AlN) on the alloy reaction tube 13 can be prevented more surely. In addition, although gas permeates from the gap 16 into the process chamber 17 through a region between the inner reaction tube 12 and the manifold 8, nitriding of silicon surfaces of substrates can be prevented because the permeating gas is hydrogen gas.

More preferably, the controller 50 may control purge of the gap 16 as follows: when the inside atmosphere of the process chamber 17 is replaced with nitrogen gas (refer to STEP: 01 and STEP: 08 of FIG. 2), the gap 16 is purged with nitrogen gas, and when the inside atmosphere of the process chamber 17 is replaced with hydrogen gas (refer to STEP: 03 and STEP: 06 of FIG. 2), the gap 16 is purged with hydrogen gas.

In addition, preferably, the controller 50 may control purge of the gap 16 in a manner such that when substrate processing starts in the process chamber 17 or a film-forming gas is supplied to the inside of the process chamber 17, purge gas of the gap 16 is changed from nitrogen gas to hydrogen gas.

Furthermore, since the inner reaction tube 12 has a function of a uniform heat pipe, the uniformity of in-furnace temperature distribution can be improved, and film-forming quality can be improved.

The temperature of the upper side of the inner reaction tube 12 is relatively high than other parts. Therefore, by supplying a purge gas to the upper end of the inner reaction tube 12, a part heated to the highest temperature can be cooled prior to other parts to increase cooling efficiency, and the temperature controllability of the inside of the process chamber 17 can be improved. In addition, although the alloy reaction tube 13 has a high thermal expansion coefficient and expands longitudinally, the inner reaction tube 12 made of quartz has a low thermal expansion coefficient as compared with a metal reaction tube, and at a high temperature condition, an upper gap between the upper end of the alloy reaction tube 13 and the upper end of the inner reaction tube 12 is widened so that a purge gas can be easily distributed throughout the gap 16 by using the upper gap.

Figure 5:
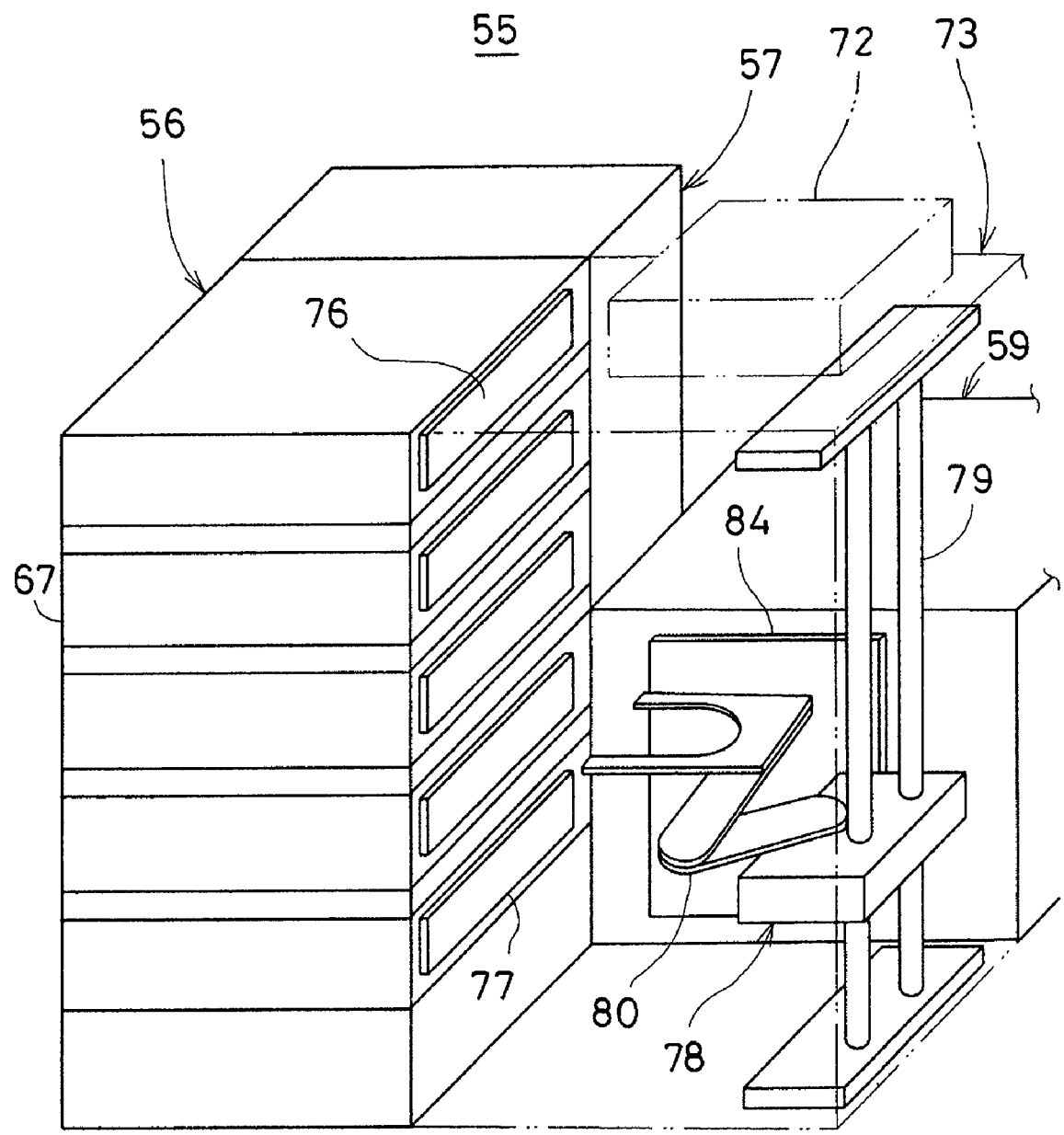
FIG. 5 is a schematic perspective view for illustrating a third embodiment of the present invention.
Figure 6:
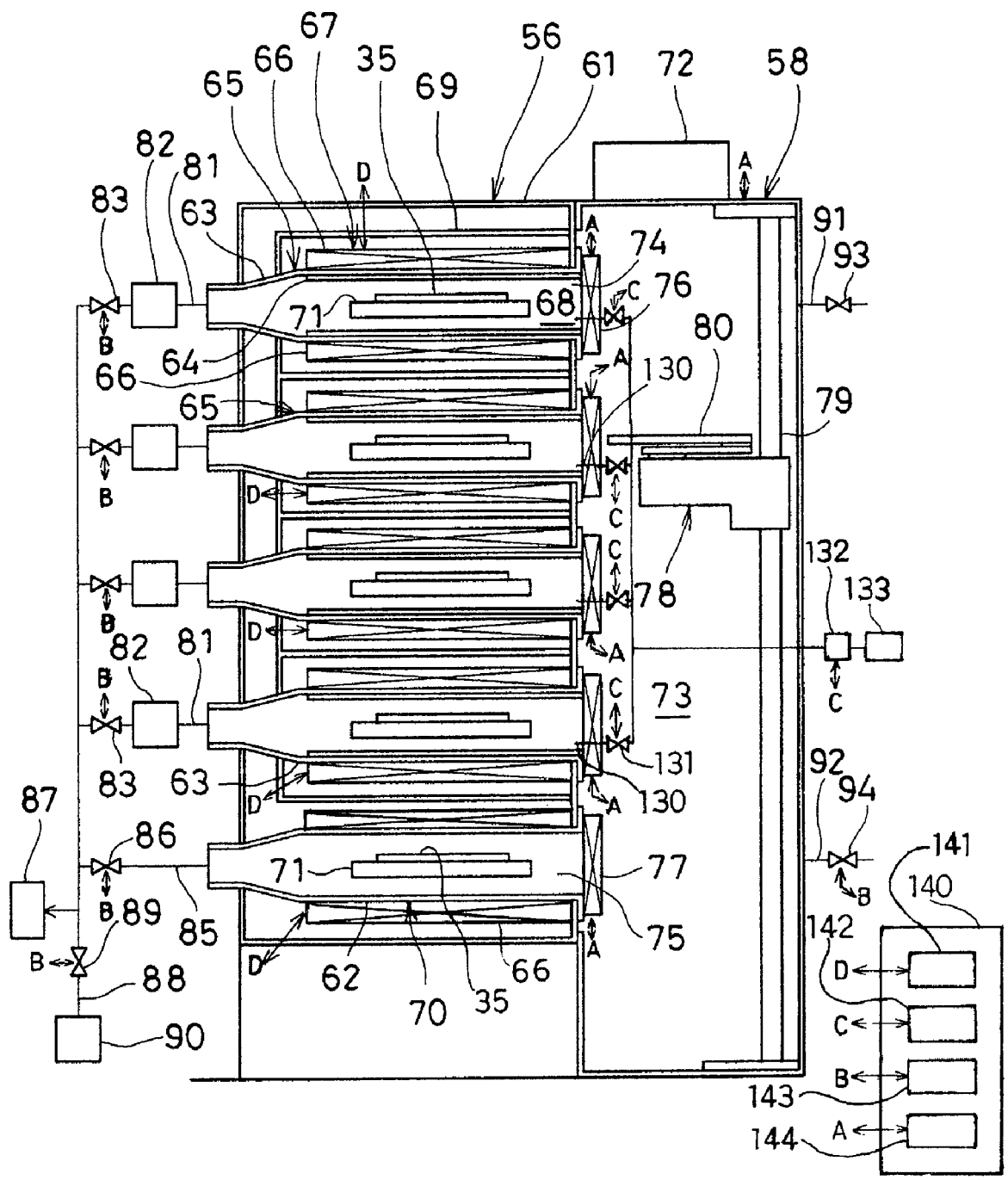
FIG. 6 is a schematic sectional elevation view for illustrating the third embodiment of the present invention.

FIG. 5 and FIG. 6 illustrate a third embodiment of the present invention.

In the third embodiment, the present invention is embodied in a single wafer type substrate processing apparatus.

A substrate processing apparatus 55 is constituted mainly by a process furnace unit 56, a control unit 57, a carrying unit 58, and a substrate accommodation unit 59.

In the substrate accommodation unit 59, substrate carrying containers (not shown) each accommodating a predetermined number of wafers 35 can be stored, and it is configured such that an external carrying device (not shown) carries a substrate carrying container accommodating non-processed wafers 35 into the substrate accommodation unit 59 and carries a substrate carrying container accommodating processed wafers 35 out of the substrate accommodation unit 59.

Next, the process furnace unit 56 will be described. As described later, the process furnace unit 56 includes a plurality of process furnaces 67 and a single buffer chamber 70 that functions as a preliminary heating chamber and a preliminary cooling chamber.

In a case 61, alloy reaction tubes 62 and 63, which have flat rectangular sections and extend horizontally, are vertically arranged in multiple stages (five stages in the drawings), and inner reaction tubes 64 made of quartz are installed in the alloy reaction tubes 62 except for the lowermost alloy reaction tube 62 such that process chambers 65 are constituted by the alloy reaction tubes 63 and the inner reaction tubes 64. Heaters 66 are installed at upper and lower sides of the process chambers 65, and process furnaces 67 are constituted by the heaters 66 and the process chambers 65. Reaction spaces 68 are formed in the process chambers 65.

The process furnaces 67 are accommodated in insulating boxes 69, and the process furnaces 67 are insulated from each other, in consideration of controllability of heating by the heaters 66.

The alloy reaction tube 62 constitutes the buffer chamber 70 functioning as a preliminary cooling chamber and a preliminary heating chamber, and is configured to heat a substrate (wafer) to a predetermined temperature before the wafer is processed or cool a wafer 35 after the wafer 35 is processed. At the upper and lower sides of the buffer chamber 70, a heater 66 is installed.

In the alloy reaction tubes 62 and 63, substrate stages 71 are installed to place process-target substrates such as wafers 35 on the substrate stages 71.

In the case 61, a carrying chamber 73 that also functions as a preliminary chamber is hermetically installed, and a cleaning unit 72 is installed at an upper side of the carrying chamber 73 to keep the carrying chamber 73 at a clean atmosphere state. In addition, preferably, an inert gas supply pipe 91 may be installed at the carrying chamber 73, and an on-off valve 93 and an inert gas supply source may be installed at the upstream side of the inert gas supply pipe 91, so as to clean the carrying chamber 73 by supplying inert gas to the carrying chamber 73. In addition, more preferably, an exhaust pipe 92 may be installed at the carrying chamber 73, and an on-off valve 94 functioning a pressure regulator and an exhaust device may be installed at the upstream side of the exhaust pipe 92, so as to cleaning the carrying chamber 73 by exhausting the carrying chamber 73.

The alloy reaction tubes 62 and 63 are opened toward the carrying chamber 73 to form furnace ports 74 and 75. The furnace ports 74 can be hermetically closed by gate valves 76, respectively, and the furnace port 75 can be hermetically closed by a gate valve 77.

A substrate carrier 78 is accommodated in the carrying chamber 73 and configured to be moved upward and downward along guide shafts 79 which is a part of an elevator, and the substrate carrier 78 includes a substrate carrying arm 80 that can be extended and rotated.

Therefore, by lifting or lowering the substrate carrier 78 and extending/retracting or rotating the substrate carrying arm 80, wafers 35 can be charged into and discharged from the alloy reaction tubes 62 and 63. After a gate valve 84 is opened, wafers 35 can be loaded into and unloaded from the process furnace unit 56 by using the substrate carrier 78.

Gas supply pipes 130 are respectively connected to the alloy reaction tubes 63 as gas supply parts. A gas supply pipe 130 is installed at the gate valve 77 in a manner such that the gas supply pipe 130 penetrates the gate valve 77. Valves 131 are installed at the upstream sides of the gas supply pipes 130, and the gas supply pipes 130 are joined together at the upstream side of the valves 131 and connected to a gas supply source 133 through a mass flow controller (MFC) 132. In addition, exhaust lines 81 and 85 are connected to the alloy reaction tubes 62 and 63, and an exhaust device 87 is connected to a line at which the exhaust lines 81 and 85 are joined together.

At the exhaust lines 81, cooling traps 82 and on-off valves 83 functioning as pressure regulators are installed. In addition, an air valve 89 and a leakage checking dry pump 90 are connected to the exhaust lines 81 through a leakage detecting line 88, and by sucking the exhaust lines 81 using the leakage checking dry pump 90, leakages of the exhaust lines 81 can be detected.

A temperature control unit 141 is electrically connected to the heaters 66 and is configured to control the heaters 66 at a desired time so as to obtain desired temperature distributions in the process chambers 65 and the buffer chamber 70 by controlling power supplied to the heaters 66 based on temperature information detected by temperature sensors (not shown).

A gas flowrate control unit 142 is electrically connected to the valves 131, the MFC 132, the gas supply source 133, and the on-off valve 93. The gas flowrate control unit 142 is configured to control the valves 131, the MFC 132, the gas supply source 133, and the on-off valve 93 at desired times, so that gas can be supplied to the process chambers 65 and the carrying chamber 73 with desired flowrates.

A pressure control unit 143 is electrically connected to the on-off valves 83, the air valve 89, and the on-off valve 94. The pressure control unit 143 is configured to control the on-off valves 83, the air valve 89, and the on-off valve 94 based on pressure information detect by pressure sensors (not shown) so as to adjust the pressures of the process chambers 65, the buffer chamber 70, and the carrying chamber 73 to desired levels.

A driving control unit 144 is electrically connected to the gate valves 76 and 77, the substrate carrier 78, and the elevator, so as to control them at desired times for performing desired operations.

The temperature control unit 141, the gas flowrate control unit 142, the pressure control unit 143, and the driving control unit 144 constitute a manipulation unit and an input/output unit, and they are configured as a controller 140.

A substrate processing method of the third embodiment will now be schematically described. In the flowing description, for conciseness, processing of a wafer 35 in one of the process furnaces 67 will only be described.

Furthermore, in the following description, operations of parts of the substrate processing apparatus 55 are controlled by the controller 140.

In a state where the gate valves 76 and 77 are closed, the carrying chamber 73 is purged with inert gas such as nitrogen gas, and the inside pressures of the alloy reaction tubes 62 and 63 and the substrate accommodation unit 59 are made to be equal. The gate valve 84 is opened, and a non-processed wafer 35 is taken out from the substrate accommodation unit 59 by using the substrate carrier 78.

The gate valve 77 of the buffer chamber 70 is opened, and the wafer 35 is placed on the substrate stage 71 by using the substrate carrier 78. The wafer 35 is preliminarily heated in the buffer chamber 70 by the heater 66 to a predetermined temperature, for example, 800° C. or lower, preferably, in the range from 500° C. to 800° C. then, the ° C., and gate valve 76 of one of the process chambers 65 where the wafer 35 will be processed is opened to transfer the wafer 35 from the buffer chamber 70 to the process chamber 65 by using the substrate carrier 78.

Then, the gate valve 76 is closed to seal the furnace port 74; the wafer 35 is heated by the heater 66, for example, to 1000° C. or higher; and a process gas is introduced from the gas supply pipe 130, so as to form a film on the wafer 35.

In addition, gas exhausted from the process chamber 65 is cooled at the cooling trap 82, so that a portion of the exhausted gas not participated in reaction can be cooled into liquid and discharged.

After the film-forming process, the gate valve 76 and the gate valve 77 are opened, and the substrate carrier 78 transfers the processed wafer 35 to the buffer chamber 70. At this time, power to the heater 66 is previously lowered or interrupted so as to cool the buffer chamber 70 to a temperature lower than the temperature of the process chamber 65, for example, in the range from 150° C. to 500° C., preferably, in the range from 200° C. to 400° C. The processed wafer 35 is cooled in the buffer chamber 70 to a predetermined temperature. The cooled wafer 35 is carried to the substrate accommodation unit 59 by the substrate carrier 78. Then, substrate processing is continued by repeating charging of a non-processed wafer 35 into the process chamber 65, processing of the wafer 35 in the process chamber 65, and carrying of the processed wafer 35 from the process chamber 65 to the substrate accommodation unit 59.

A detailed description of substrate processing will not be repeated because it is the same as that described in the first embodiment.

In the case where substrates are processed in a plurality of process furnaces 67 (four process furnaces in the drawings), substrate processing in the process furnaces 67 may be shifted in a manner such that when a substrate carrying operation of the substrate carrier 78 is performed on one of the process furnaces 67, substrate processing is performed in at least one of the other three process furnaces 67. By this, a delay caused by substrate carrying operations into and out of the process furnaces 67 can be prevented, and thus efficient substrate processing is possible.

Furthermore, in the current embodiment, since the alloy reaction tubes 63 are used instead of using high-precision quartz reaction tubes like the first embodiment in which the alloy reaction tube 13 is used, the manufacturing costs of the alloy reaction tubes 63 are low, and thus the manufacturing costs of the process furnaces 67 can be reduced. In addition, preferably, the inner reaction tubes 64 are installed in the process chambers 65 for improving film-forming quality; however, it is not necessary that the inner reaction tubes 64 are airtight or precisely machined. Therefore, the inner reaction tubes 64 can be manufactured with low costs. Furthermore, like in the case of the first embodiment, the process chambers 65 may be constituted only by the alloy reaction tubes 63 without using the inner reaction tubes 64. Moreover, if the substrate processing apparatus 55 is used only at temperatures lower than 1150° C., the alloy reaction tubes 63 may be made of an aluminum (Al)-containing heat-resistant and corrosion-resistant alloy, for example, simply made of Inconel (registered trademark).

In addition, in the current embodiment, since a plurality of process furnaces 67 and a buffer chamber 70 are arranged in the same column in multiple stages, power-supply lines can be easily laid, and energy efficiency can be improved. Furthermore, substrate carrying efficiency can be improved, and substrates can be processed with high efficiency.

Furthermore, it takes much time to steeply increase the temperature of the process chambers 65 from room temperature to a process temperature, and it also takes much time to steeply decrease the temperature of the process chambers 65 from the process temperature to room temperature. If substrates are carried into the process chambers 65 in a state where the process chambers 65 are kept at a predetermined temperature, for example, a temperature higher than room temperature but lower than a process temperature, the substrates may be thermally damaged. In addition, if the process chambers 65 of the process furnaces 67 are operated with different heating/cooling timings, time lag may easily occur in process end and start timing of the respective process chambers 65. However, by arranging the plurality of process furnaces 67 and the single buffer chamber 70 in the same column in multiple stages and heating a substrate in the buffer chamber 70 preliminarily, the substrate can be protected from being damaged, and thus substrate processing can be performed with high efficiency. In addition, carrying efficiency can also be improved.

Due to thermal characteristics, it may be easiest to increase the temperature of the periphery of the uppermost process furnace 67 but it may be most difficult to increase the temperature of the lowermost buffer chamber 70. Therefore, the buffer chamber 70 is installed at the lowermost side because it is less required to increase the temperature of the buffer chamber 70 than to increase the temperature of the process furnaces 67, and by this, thermal energy can be efficiently consumed.

Figure 7:
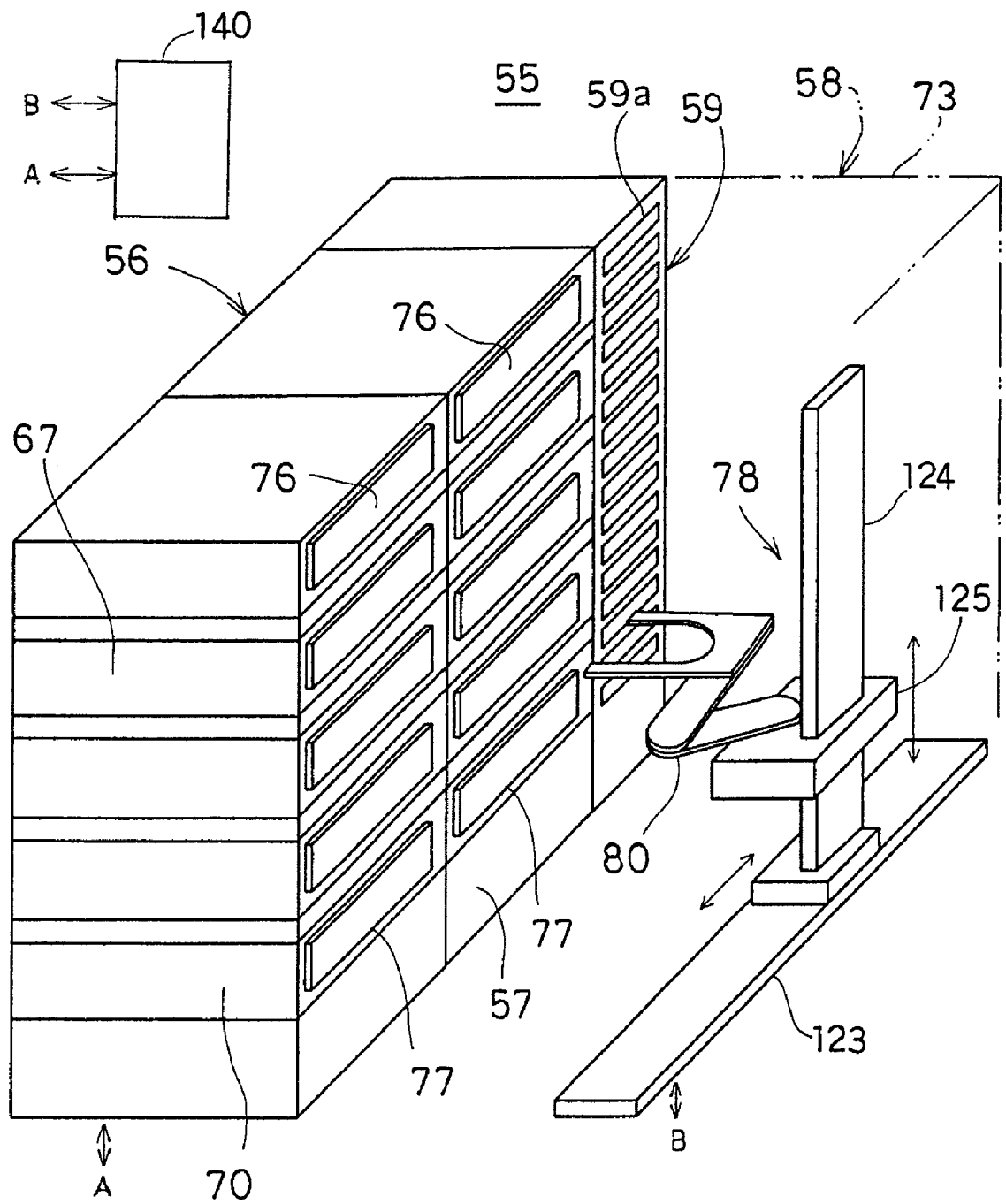
FIG. 7 is a schematic perspective view for illustrating a fourth embodiment of the present invention.

FIG. 7 illustrates a fourth embodiment of the present invention.

In the fourth embodiment, the present invention is embodied in another single wafer type substrate processing apparatus. In FIG. 7, the same elements as those illustrated in FIG. 5 are denoted by the same reference numerals.

In the fourth embodiment, a process furnace unit 56 is configured by process furnaces 67 arranged in multiple rows and columns. In the illustrated example, the process furnace unit 56 is configured by process furnaces 67 arranged in 5 rows and 2 columns. In each column, the lowermost one of the process furnaces 67 is configured as a buffer chamber 70 that also function as a preliminary heating/cooling chamber. The numbers of rows and columns of the process furnaces 67 may be properly selected according to the capacity of a substrate processing apparatus 55.

At the lower side of the process furnace unit 56, a control unit 57 is installed, and at a side of the process furnace unit 56, a substrate accommodation unit 59 is installed. The process furnace unit 56 can accommodate about twice as many wafers 35 as the number of the process furnaces 67 of the process furnace unit 56. For example, the upper half of the substrate accommodation unit 59 may be used to accommodate processed wafers, and the other lower half may be used to accommodate non-processed wafers.

A substrate carrier 78 includes transverse actuation parts 123 and 124. The transverse actuation part 124 can be transversely moved in parallel with the process furnace unit 56 along the transverse actuation part 123, and an elevating base 125 can be moved upward and downward along the transverse actuation part 124. A substrate carrying arm 80 is installed at the elevating base 125. By extending and retracting operations of the substrate carrying arm 80 associated with operations of the transverse actuation part 123 and the transverse actuation part 124, a wafer 35 can be carried from an outside area of the substrate processing apparatus 55 to the substrate accommodation unit 59 of a carrying chamber 73. Then, the wafer 35 can be transferred from the substrate accommodation unit 59 to the process furnace unit 56. Thereafter, the wafer 35 can be transferred from the process furnace unit 56 to the substrate accommodation unit 59, and then the wafer 35 can be carried out to the outside area of the substrate processing apparatus 55.

The substrate carrier 78 is accommodated in the carrying chamber 73, and the carrying chamber 73 is kept in a clean state by a cleaning unit (refer to FIG. 5) installed at the ceiling of the carrying chamber 73.

In the fourth embodiment, more process furnaces 67 can be used by arranging the process furnaces 67 in multiple columns, and thus, a plurality of substrates can be processed at one time even though a single wafer processing method is used.

FIG. 8 to FIG. 11 illustrate a fifth embodiment. In the fifth embodiment, a single wafer processing method is used, and process furnaces 67 are installed in multiple rows and columns. In addition, it is configured such that a plurality of substrates 102 can be processed in one process furnace 67, so as to process much more substrates.

Figure 8:
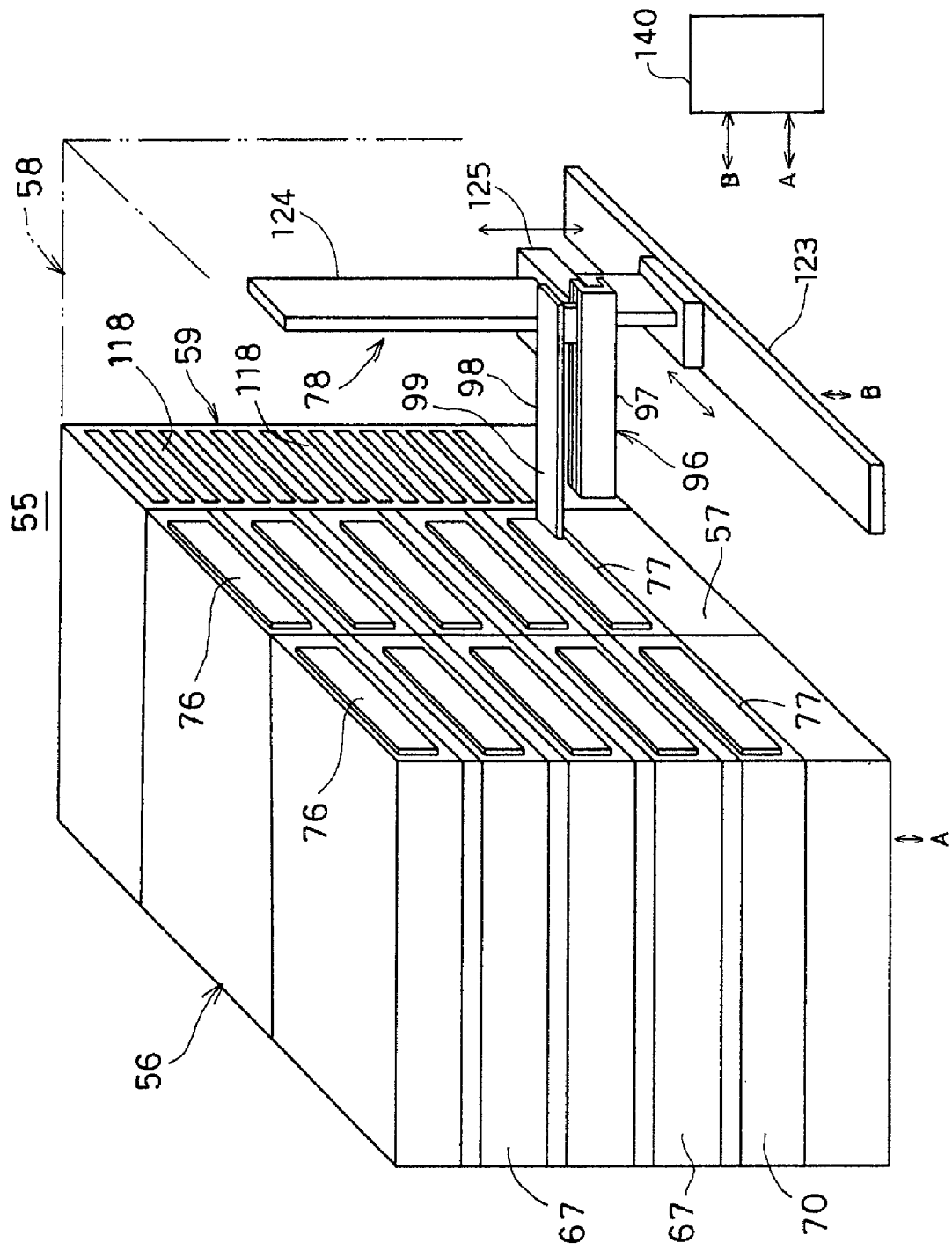
FIG. 8 is a schematic perspective view for illustrating a fifth embodiment of the present invention.

First, with reference to FIG. 8, a brief overview will be given on a substrate processing apparatus according to the fifth embodiment. In FIG. 8, the same elements as those illustrated in FIG. 7 are denoted by the same reference numerals.

A transverse actuation part 124 is installed on a transverse actuation part 123 in a manner such that the transverse actuation part 124 can be transversely moved in parallel with a process furnace unit 56. An elevating base 125 is installed on the transverse actuation part 124 in a manner such that the elevating base 125 can be moved upward and downward, and a substrate carrying arm 96 is installed on the elevating base 125 in a direction perpendicular to the direction of the transverse movement and the direction of the upward/downward movement. In addition, the substrate carrying arm 96 can be reciprocated with respect to the process furnaces 67.

In the fourth embodiment, the substrate carrying arm 80 has a multiple link structure in which a plurality of links can be stretched and bent. However, in the fifth embodiment, the substrate carrying arm 96 has a structure capable of reciprocating within a wider range, such as a multiple slider structure.

A first slide arm 97 is installed on the elevating base 125 in a manner such that the first slide arm 97 can be horizontally slid, and a second slide arm 98 is installed on the first slide arm 97 in a manner such that the second slide arm 98 can be horizontally slid. The second slide arm 98 includes a supporting plate 99 on which a susceptor 101 (refer to FIG. 10) also functioning as a substrate holder can be placed, and the supporting plate 99 is configured to be moved into and out of the process furnaces 67.

Figure 10:
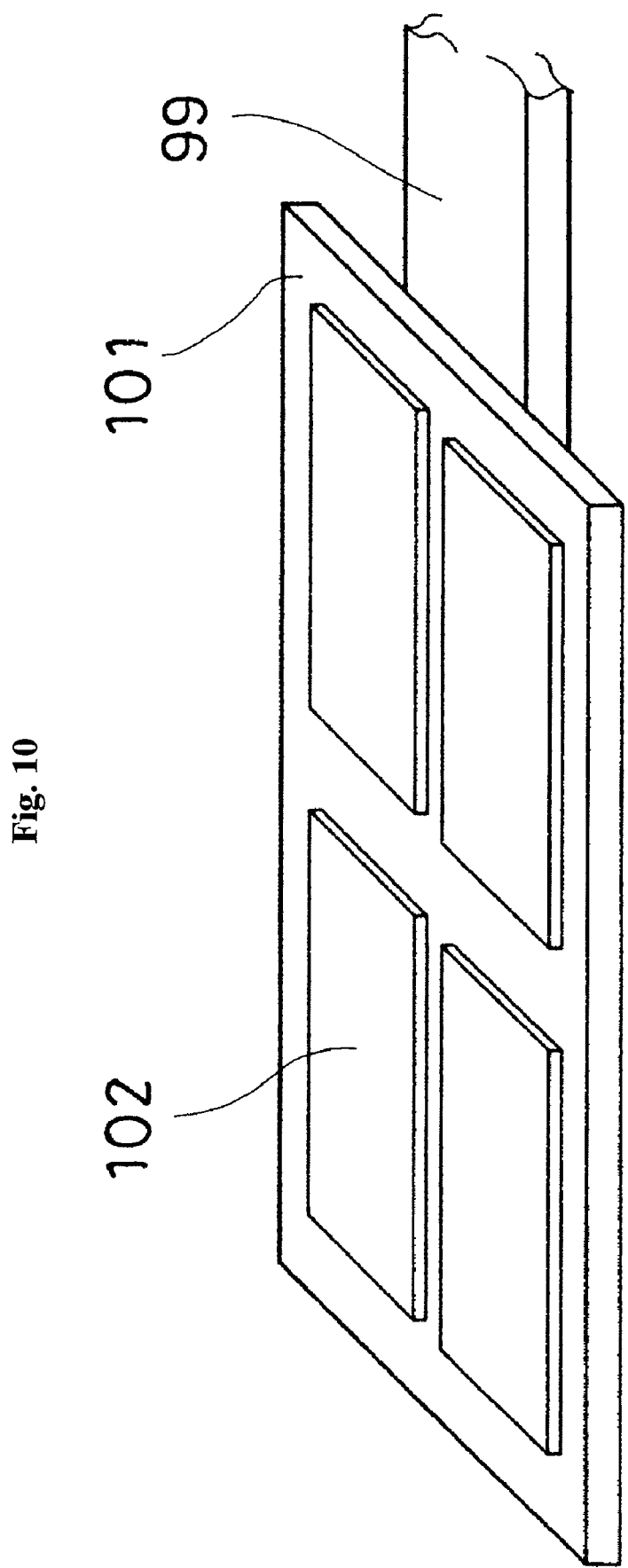
FIG. 10 is a schematic perspective view illustrating a susceptor and substrates according to the fifth embodiment of the present invention.

A plurality of substrates 102 can be placed on the susceptor 101, and the plurality of substrates 102 can be transferred together in a way of moving the susceptor 101 into the process furnace 67 or the substrate accommodation unit 59 while holding the susceptor 101 with the supporting plate 99. In FIG. 10, the susceptor 101 has a rectangular shape, and four rectangular substrates are placed on the susceptor 101 in a rectangular matrix form. However, the shape of the susceptor 101, and the number of substrates that can be placed on the susceptor 101 may be varied.

Figure 9:
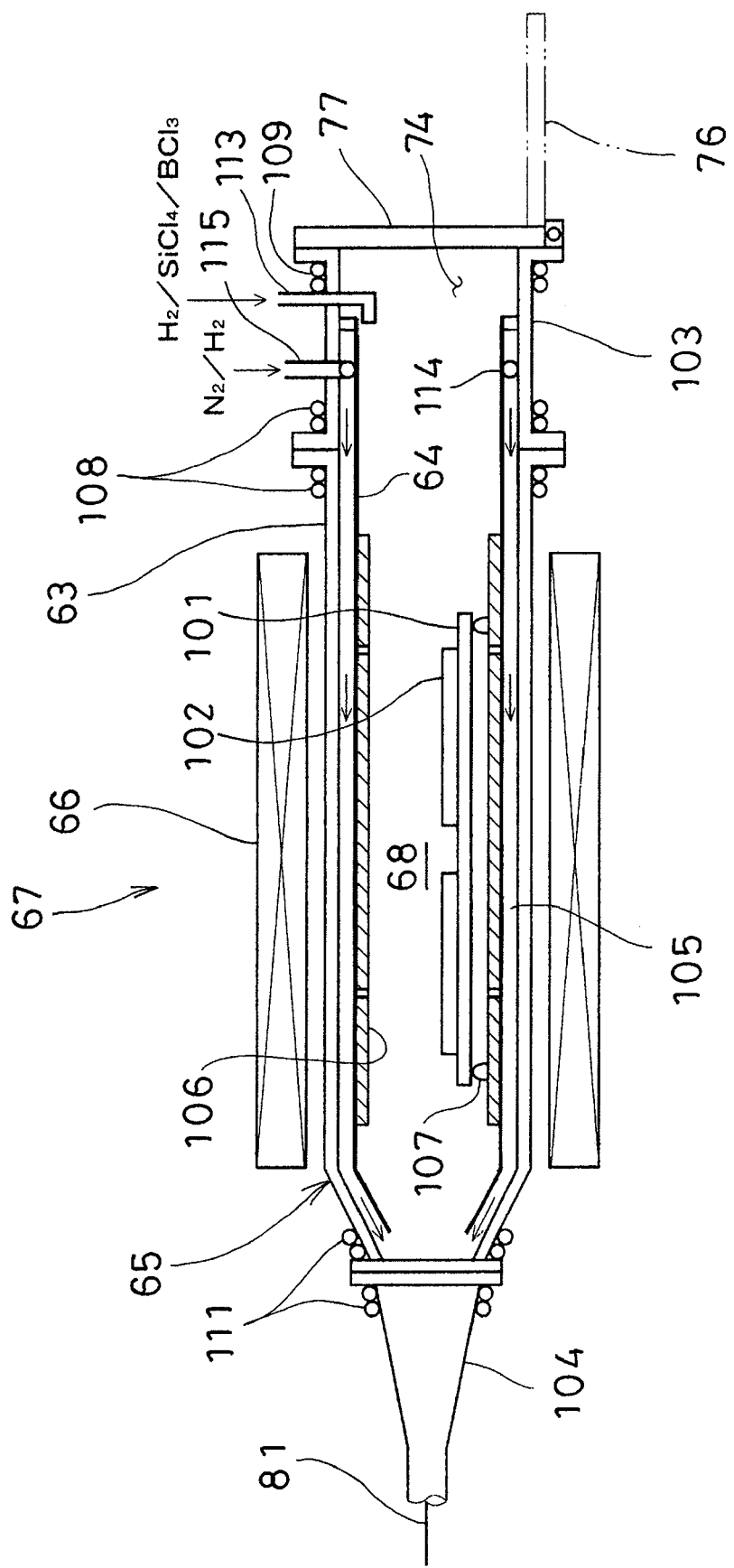
FIG. 9 is a sectional view illustrating a process furnace according to the fifth embodiment of the present invention.

Next, with reference to FIG. 9, an example of the process furnaces 67 will be described according to the fifth embodiment. In FIG. 9, the same elements as those illustrated in FIG. 6 are denoted by the same reference numerals.

At the front end (left side in FIG. 9) of an alloy reaction tube 63 having a flat hollow sectional shape, a furnace port flange 103 made of a metal is hermetically installed, and at the rear end of the alloy reaction tube 63, an exhaust port flange 104 made of a metal is hermetically installed. The alloy reaction tube 63, the furnace port flange 103, and the exhaust port flange 104 constitutes a process chamber 17.

The alloy reaction tube 63 is made of the same material as that used for making the alloy reaction tube 13 of the first embodiment. That is, the alloy reaction tube 63 is made of a heat-resistant and corrosion-resistant alloy not containing copper (Cu) and/or aluminum (Al), such as Inco HX (registered trademark) or Hastelloy X (registered trademark) that includes 47.5% of nickel (Ni), 21.8% of chromium (Cr), 9.0% of molybdenum (Mo), 18.5% of iron (Fe), 1.5% of cobalt (Co), and 0.6% of tungsten (W). In addition, the furnace port flange 103 and the exhaust port flange 104 is made of stainless steel such as SUS306 (stainless steels prescribed in the Japanese Industrial standard).

That is, the furnace port flange 103, the exhaust port flange 104, and the alloy reaction tube 63 can be manufacturing with low costs, and thus the process chamber 17 can be manufacturing with low costs. In addition, by forming the furnace port flange 103 and the exhaust port flange 104 into high-strength structures, the strength of the flat process furnace 67 can be reinforced.

Inside the process chamber 17, an inner reaction tube 64 made of quartz is installed. The inner reaction tube 64 has a hollow sectional shape similar to the shape of the alloy reaction tube 63 and extends from the rear end part of the furnace port flange 103 to the rear end of the alloy reaction tube 63, and a reaction space 68 is formed in the inner reaction tube 64 so as to process substrates in the reaction space 68. Between the alloy reaction tube 63 and the inner reaction tube 64, a flat cylindrical gap 105 is formed. The front end of the gap 105 is closed by a flange part formed at the front end of the inner reaction tube 64.

Furthermore, an inner wall plate 106 made of silicon carbide (SiC) is installed on the inner wall surface of the inner reaction tube 64. The inner wall plate 106 is installed on at least the ceiling surface (preferably, on both the ceiling and bottom surfaces) of the inner reaction tube 64.

Like the case where silicon atoms are attached to a quartz part and a silicon film is formed on the quartz part, silicon atoms are attached to a silicon-carbide part and a silicon film is formed on the silicon-carbide part. However, the coefficient of thermal expansion of silicon is $3.9 \times 10^{-6}$/K, which is different from the coefficient of thermal expansion of quartz, $0.5 \times 10^{-6}$/K, by one decimal digit. Therefore, after a silicon film is formed on the inner reaction tube 64, if the heating state of a heater 66 is varied, that is, if the temperature of the inner reaction tube 64 and the silicon film is varied, the silicon film may be stripped due to difference in thermal expansion. However, the coefficient of thermal expansion of silicon carbide, $4.3 \times 10^{-6}$/K, is similar to the coefficient of thermal expansion of silicon. Therefore, after a silicon film is formed on the inner wall plate 106, although the heating state of the heater 66 is varied, that is, although the temperature of the inner reaction tube 64 and the silicon film is varied, the silicon film may not be easily stripped because there may be only a small difference in thermal expansion.

In the case where the inner wall plate 106 is made of silicon carbide, the inner wall plate 106 has good characteristics with less deterioration; however, the inner wall plate 106 may be made of carbon or alumina ($Al_2O_3$) coated with silicon carbide. Furthermore, in the case where the inner wall plate 106 is made of a silicon-carbide member having a plate shape, the inner wall plate 106 may occupy less area in the process chamber 17; however, the inner wall plate 106 may have other shapes. For example, the inner wall plate 106 may have a ring-shape concentric with the inner reaction tube 64.

Boss-shaped susceptor supporting parts 107 are protruded from four lower positions of the inner reaction tube 64, and the susceptor 101 can be placed on the susceptor supporting parts 107.

The front and rear end parts of the alloy reaction tube 63 are protruded from the heater 66. A cooling conduit 108 is wound around a joint part between the front end part of the alloy reaction tube 63 and the furnace port flange 103, and a cooling conduit 109 is wound around the front end part of the furnace port flange 103, so that a furnace port 74 can be cooled by circulating a coolant through the cooling conduits 108 and 109. In addition, a cooling conduit 111 is wound around a joint part between the rear end part of the alloy reaction tube 63 and the exhaust port flange 104, such that an exhaust port part can be cooled by circulating a coolant through the cooling conduit 111. Since the furnace port flange 103 and the exhaust port flange 104 are cooled, the furnace port flange 103 and the exhaust port flange 104 can be made of inexpensive materials.

A gas introducing nozzle 113 is installed through the top surface of the furnace port flange 103, and in this state where the process chamber 17 is opened through the gas introducing nozzle 113, the upstream side of the gas introducing nozzle 113 is connected to a process gas source (not shown).

At an end part of the gap 105 facing the furnace port 74, a ring-shaped purge gas introducing nozzle 114 is installed as a purge gas supply part in a manner such that the purge gas introducing nozzle 114 is wound around the inner reaction tube 64. Gas injection holes (not shown) are bored through the purge gas introducing nozzle 114 at predetermined intervals so that purge gas can be injected uniformly into the gap 105 through the gas injection holes. The purge gas introducing nozzle 114 is connected to a purge gas source through a purge gas pipe 115, and the purge gas supply source is configured to supply nitrogen gas and hydrogen gas selectively.

The exhaust port flange 104 is connected to an exhaust device 87 through an exhaust line 81, a cooling trap 82, and an on-off valve 83 (refer to FIG. 6). By using the exhaust device 87, the reaction space 68 can be exhausted by suction through the exhaust port flange 104, and at the same time, the gap 105 can be exhausted by suction.

Next, the substrate accommodation unit 59 will be described.

The substrate accommodation unit 59 is constituted by about twice as many vertically-stacked susceptor accommodation shelves 118 as the number of the process furnaces 67 of the process furnace unit 56. For example, the upper half of the substrate accommodation unit 59 is used to accommodate susceptors 101 on which processed substrates are placed, and the other lower half of the substrate accommodation unit 59 is used to accommodate susceptors 101 on which non-processed substrates are placed.

By reciprocating, lifting, and lowering the supporting plate 99, a susceptor 101 can be placed in the susceptor accommodation shelf 118, and substrates 102 can be individually transferred to the susceptor 101.

Figure 11:
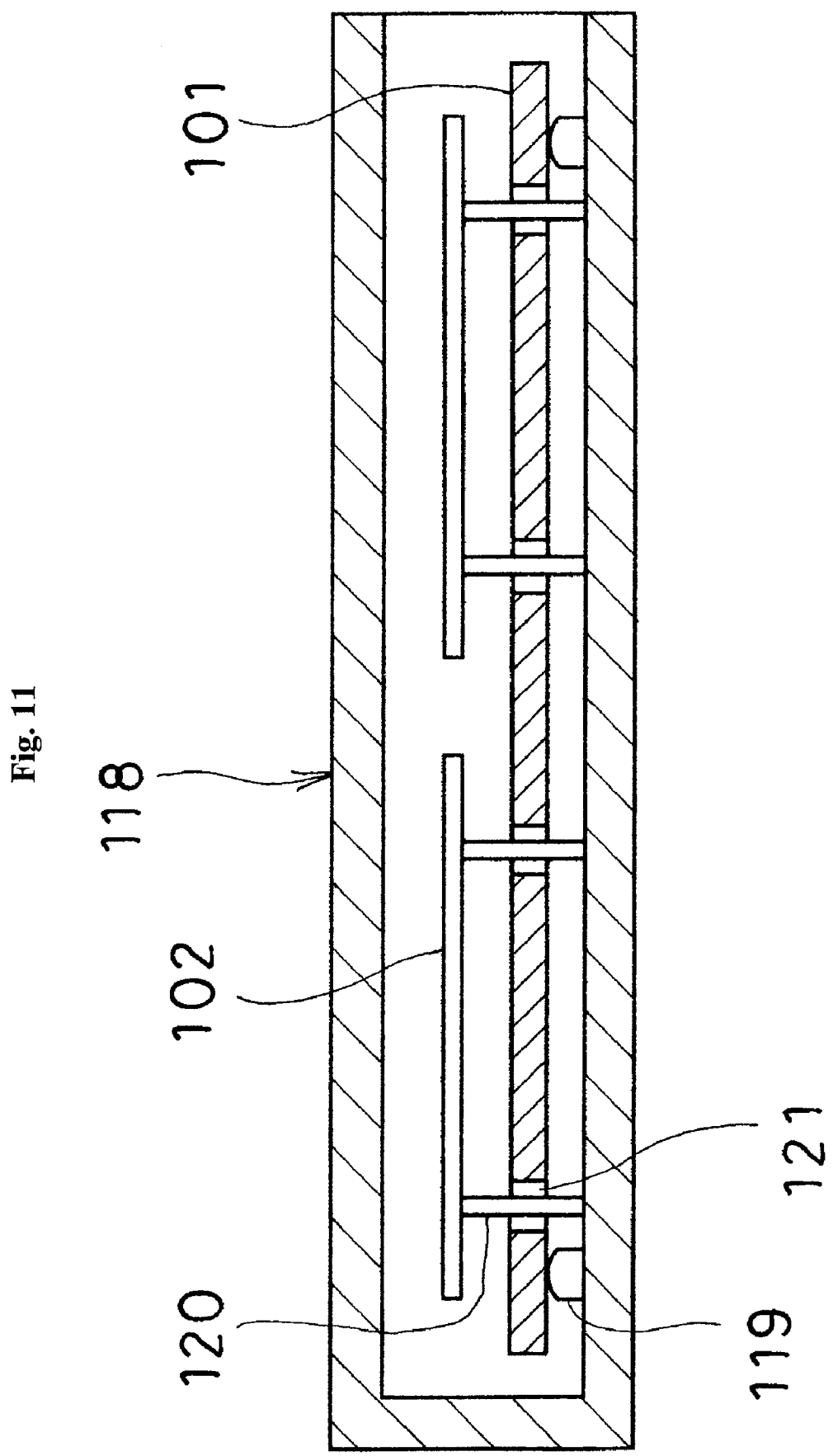
FIG. 11 is a schematic sectional view illustrating a susceptor accommodation shelf according to the fifth embodiment of the present invention.

As shown in FIG. 11, susceptor supporting bosses 119 and substrate supporting pins 120 are protruded from the bottom surface of the susceptor accommodation shelf 118, and the height of the substrate supporting pins 120 is greater than the sum of the height of the susceptor supporting bosses 119, the thickness of the susceptor 101, and the thickness of the supporting plate 99.

Relief holes 121 are bored in the susceptor 101 such that when the susceptor 101 is placed on the susceptor supporting bosses 119, the substrate supporting pins 120 are inserted through the relief holes 121. Therefore, when a susceptor 101 on which substrates 102 are placed is accommodated in the susceptor accommodation shelf 118, the susceptor 101 is placed on the susceptor supporting bosses 119, and at the same time, the substrate supporting pins 120 are inserted through the relief holes 121, such that the substrates 102 are individually placed on the substrate supporting pins 120 in a state where the substrates 102 are spaced apart from the susceptor 101.

After the susceptor 101 is accommodated, a substrate carrier 78 can be operated to carry out the substrates 102 from the susceptor accommodation shelf 118 one by one by using the supporting plate 99.

A desired number of substrates 102 can be placed on the susceptor 101 as follows: first, the susceptor 101 is accommodated into the susceptor accommodation shelf 118; substrates 102 are carried into the susceptor accommodation shelf 118 and placed on the substrate supporting pins 120; and if a desired number of substrates 102 are placed, the susceptor 101 is lifted from the susceptor accommodation shelf 118 and is moved back away from the susceptor accommodation shelf 118. In this way, a desired number of substrates 102 can be carried out from the susceptor accommodation shelf 118 in a state where the substrates 102 are placed on the susceptor 101.

Furthermore, in the case where substrate supporting pins are provided at the susceptor 101, the substrate supporting pins 120 of the susceptor accommodation shelf 118 are not necessary.

Hereinafter, according to the fifth embodiment, substrate processing procedures will be described. A detailed description of substrate processing will not be repeated because it is the same as that described in the first embodiment.

Susceptors 101 are previously placed in the susceptor accommodation shelves 118 of the substrate accommodation unit 59 that are used for accommodating non-processed substrates.

By using the substrate carrier 78, a predetermined number of substrates 102 are transferred to the respectively susceptor accommodation shelves 118. If a predetermined number of substrates 102 are transferred to a predetermined one of the susceptor accommodation shelves 118, the substrate carrier 78 carries the susceptor 101 from the susceptor accommodation shelf 118 that is used for accommodating non-processed substrates. At this time, a predetermined number of substrates 102 are placed on the susceptor 101 (in the drawing, four substrates 102).

The susceptor 101 which is carried out from the susceptor accommodation shelf 118 by using the substrate carrier 78 is carried into a buffer chamber 70 where the susceptor 101 is pre-heated to 800° C. or lower, preferably, in the range from 500° C. to 800° C., and the susceptor 101 is carried into a predetermined process furnace 67 of the process furnace unit 56. At this time, so as to reduce the transfer distance, the predetermined process furnaces 67 is selected from a column in which the buffer chamber 70 is located.

The furnace port 74 is hermetically closed by a gate valve 76; the substrates 102 placed on the susceptor 101 are heated by the heater 66; and a process gas is introduced through the gas introducing nozzle 113. In addition, a purge gas is introduced to the purge gas introducing nozzle 114 from the purge gas pipe 115, and then, the purge gas is introduced into the gap 105 from the purge gas introducing nozzle 114.

While substrate processing is not performed, nitrogen gas is introduced into the gap 105 as a purge gas; however, so as to prevent attachment of nitrides to the substrates 102 caused by nitrogen gas, hydrogen gas is introduced into the gap 105 while substrate processing is performed, for example, at least while a process gas is introduced.

The reaction space 68 is exhausted through the exhaust port flange 104 by the exhaust device 87. Since the rear end of the inner reaction tube 64 is adjacent to the rear end of the alloy reaction tube 63 and the rear end of the gap 105 is opened at a position close to the exhaust port flange 104, the inside of the gap 105 is also exhausted by the exhaust device 87 so that purge gas introduced into the gap 105 may not permeate into the reaction space 68.

If the film-forming process is completed, after opening gate valves 76 and 77, the susceptor 101 on which the processed substrates 102 are placed is taken out of the process furnace 67 by the substrate carrier 78 and is transferred to the buffer chamber 70, and in the buffer chamber 70, the susceptor 101 is cooled to a predetermined temperature, for example, in the range from 150° C. to 500° C., preferably, 200° C. After cooling, the substrate carrier 78 transfers the susceptor 101 to a susceptor accommodation shelf 118 of the process furnace unit 56 which is used for accommodating processed substrates.

Thereafter, the substrate carrier 78 carries out the processed substrates 102 individually.

Substrate processing is continued by repeating charging of non-processed substrates 102 into the susceptor accommodation shelf 118 of the process furnace unit 56, loading of a susceptor 101 on which non-processed substrates 102 are placed into the process chamber 65, and processing of the substrates 102 in the process chamber 65.

In addition, since the temperature of the susceptor 101 is high after the film-forming process, the substrate carrying arm 96 used for carrying the susceptor 101 is heated. Therefore, the substrate carrying arm 96 may be covered with a heat shield cover. The heat shield cover may be an extendable bellows made of a heat-resistant material.

According to the present invention, in the substrate processing apparatus, the quartz reaction tube is installed in the alloy reaction tube, and the purge gas supply part is configured to supply a purge gas to a gap formed between the alloy reaction tube and the quartz reaction tube. In addition, the controller is configured to perform a control operation such that hydrogen gas is supplied from the purge gas supply part to the gap as a purge gas when a film-forming gas is supplied from the gas supply part to the inside of the process chamber to process the substrate in the process chamber. In addition, the purge gas supply part is installed at an upper end of the alloy reaction tube. In addition, an exhaust port is installed in the quartz reaction tube such that the gap communicates with the process chamber. In addition, a member made of silicon carbide is installed at an upper part of an inner wall of the quartz reaction tube. In addition, a plurality of process chambers are installed in vertically multiple stages, and a preliminary heating chamber is installed next the lowermost one of the process chambers.

In addition, according to the present invention, there is provided a method of manufacturing a semiconductor device. The method includes a process of loading a substrate into a process chamber constituted by an alloy reaction tube made of a material including at least molybdenum (Mo) and cobalt (Co) but not comprising aluminum (Al); a process of processing the substrate by heating an inside of the process chamber and supplying gas to the inside of the process chamber; and a process of unloading the substrate from the process chamber.

According to the present invention, the substrate processing apparatus includes the process chamber configured to accommodate a substrate and process the substrate, the heater configured to heat the substrate, and the gas supply part configured to supply a gas to an inside of the process chamber. The process chamber includes an alloy reaction tube made of a material including at least molybdenum (Mo) but not including aluminum (Al). Therefore, material costs and manufacturing costs of the process chamber can be reduced, and thus substrate processing costs can be reduced.

In addition, according to the present invention, the quartz reaction tube is installed in the alloy reaction tube, and the purge gas supply part is configured to supply a purge gas to a gap formed between the alloy reaction tube and the quartz reaction tube. Therefore, processing quality can be improved, and since the quartz reaction tube is not necessary to be a strong member or airtight vessel, material costs and machining precision can be lowered so that the substrate processing apparatus can be manufacturing with lower costs. In addition, since a purge gas is introduced into the gap, contamination of substrates can be prevented, and the process chamber can be cooled by the purge gas for improving cooling efficiency and production efficiency.

In addition, according to the present invention, the controller is configured to perform a control operation such that hydrogen gas is supplied from the purge gas supply part to the gap as a purge gas when a film-forming gas is supplied from the gas supply part to the inside of the process chamber to process the substrate in the process chamber. Therefore, influence of a purge gas on substrate processing can be reduced, and substrate processing quality can be improved.

In addition, according to the present invention, since the purge gas supply part is installed at an upper end of the alloy reaction tube, a purge gas can be supplied through the upper end of the alloy reaction tube so as to cool the hottest part prior to other parts, and thus cooling efficiency can be increased for improving the temperature controllability of the inside of the process chamber.

In addition, according to the present invention, the exhaust port is installed in the quartz reaction tube to connect the gap and the process chamber so that purge gas can be aggressively relieved.

In addition, according to the present invention, the member made of silicon carbide is installed at an upper part of the inner wall of the quartz reaction tube, that is, a part made of silicon carbide to which a substance is not easily attached is installed at the upper part of the inner wall of the quartz reaction tube to which a substance produced by reaction of process gas can be easily attached, so that deposition of such an attachment substance on the inner wall of the process chamber can be suppressed.

In addition, according to the present invention, a plurality of process chambers are installed in vertically multiple stages, and the preliminary heating chamber is installed next the lowermost one of the process chambers, that is, the process chambers and the preliminary heating chamber are installed one after another in vertically multiple stages, so that power supply lines can be easily laid, and thus energy efficiency can be improved.

In addition, according to the present invention, the reaction tube constitutes the process chamber configured to accommodate and process a substrate and is covered with the heater configured to heat the substrate, and the reaction tube is configured such that gas is supplied to an inside of the process chamber. In addition, the reaction tube is made of a material containing at least molybdenum (Mo) and cobalt (Co) but not containing aluminum (Al). Therefore, the reaction tube for processing a substrate can be manufactured with low costs.

SUPPLEMENTARY NOTE

The present invention also includes the following embodiments.

Supplementary Note 1

According to an embodiment of the present invention, there is provided a substrate processing apparatus comprising: a process chamber configured to accommodate a substrate and process the substrate; a heater configured to heat the substrate; a gas supply part configured to supply a gas to an inside of the process chamber; and a control unit configured to control the process chamber, the heater, and the gas supply part, wherein the process chamber is constituted by a heat-resistant, corrosion-resistant alloy reaction tube.

Supplementary Note 2

In the substrate processing apparatus of Supplementary Note 1, a quartz reaction tube is installed in the alloy reaction tube.

Supplementary Note 3

In the substrate processing apparatus of Supplementary Note 1 or 2, at least $H_2$ gas is supplied to the inside of the process chamber. According to the present invention, although dangerous gas such as $H_2$ gas is used, since the alloy reaction tube has relatively high strength, risks can be reduced.

Supplementary Note 4

In the substrate processing apparatus of Supplementary Note 1 or 2, the inside of the process chamber is kept at 1000° C. or higher. According to the present invention, since the alloy reaction tube is highly heat-resistant, processing is possible at a temperature of 1000° C. or higher.

Supplementary Note 5

In the substrate processing apparatus of Supplementary Note 2, a purge gas is supplied through an upper part of the alloy reaction tube and flows between the alloy reaction tube and the quartz reaction tube.

Supplementary Note 6

In the substrate processing apparatus of Supplementary Note 1 or 2, the process chamber is capable of accommodating a substrate holder in which a necessary number of substrates are charged, and the process chamber is capable of performing a batch process.

Supplementary Note 7

In the substrate processing apparatus of Supplementary Note 1 or 2, the process chamber comprises single wafer type process chambers each capable of accommodating one substrate and performing a single wafer processing process.

Supplementary Note 8

In the substrate processing apparatus of Supplementary Note 7, a single wafer type process furnace is constituted by the single wafer type process chamber and a heater configured to heat a substrate.

Supplementary Note 9

In the substrate processing apparatus of Supplementary Note 8, substrate processing completion times of the single wafer type process furnaces are different, and when a substrate is loaded/unloaded with respect to one single wafer type process furnace, a processing process is performed on at least one substrate of other single wafer type process furnaces.

Supplementary Note 10

In the substrate processing apparatus of Supplementary Note 1, the substrate is accommodated in the process chamber in a state where the substrate is placed on a susceptor.

Supplementary Note 11

In the substrate processing apparatus of Supplementary Note 10, the susceptor is capable of receiving a plurality of substrates, and substrates are carried in a state where the substrates are placed on the susceptor.

Supplementary Note 12

According to another embodiment of the present invention, there is provided a substrate processing apparatus comprising: a process chamber configured to accommodate a substrate and process the substrate; a heater configured to heat the substrate; and a gas supply part configured to supply a gas to an inside of the process chamber, wherein the process chamber comprising an alloy reaction tube made of a material comprising at least molybdenum (Mo) and cobalt (Co) but not comprising aluminum (Al).

Supplementary Note 13

In the substrate processing apparatus of Supplementary Note 12, the alloy reaction tube is made of a material comprising tungsten (W) but not comprising copper (Cu).

Supplementary Note 14

According to another embodiment of the present invention, there is provided a method of manufacturing a semiconductor device, the method comprising: loading a substrate into a process chamber constituted by an alloy reaction tube made of a material comprising at least molybdenum (Mo) and cobalt (Co) but not comprising aluminum (Al); heating an inside of the process chamber and supplying hydrogen gas to the inside of the process chamber; processing the substrate by supplying a process gas to the inside of the process chamber under a hydrogen gas atmosphere; exhausting the process gas from the inside of the process chamber to replace the inside of the process chamber with hydrogen gas atmosphere and cool the process chamber; supplying nitrogen gas so as to replace hydrogen gas with nitrogen gas; and unloading the substrate from the process chamber.

What is claimed is:

1. A substrate processing apparatus comprising:
    a process chamber configured to accommodate a substrate and process the substrate, the process chamber comprising an alloy reaction tube made of a material comprising at least molybdenum (Mo) and cobalt (Co) and excluding aluminum (Al);
    a heater configured to heat the substrate;
    a gas supply part configured to supply a gas to an inside of the process chamber;
    a quartz reaction tube installed in the alloy reaction tube; and
    a purge gas supply part configured to supply a purge gas to a gap formed between the alloy reaction tube and the quartz reaction tube.

2. The substrate processing apparatus of claim 1, further comprising:
    a controller configured to perform a control operation such that hydrogen gas is supplied from the purge gas supply part to the gap as a purge gas when a film-forming gas is supplied from the gas supply part to the inside of the process chamber to process the substrate in the process chamber.

3. The substrate processing apparatus of claim 1, wherein the purge gas supply part is installed at an upper end of the alloy reaction tube.

4. The substrate processing apparatus of claim 1, further comprising:
    an exhaust port installed in the quartz reaction tube such that the gap communicates with the process chamber.

5. The substrate processing apparatus of claim 1, further comprising:
    a member made of silicon carbide installed at an upper part of an inner wall of the quartz reaction tube.

6. The substrate processing apparatus of claim 1, wherein a plurality of the process chamber is vertically installed in multiple stages, and a preliminary heating chamber is installed next to a lowermost one of the plurality of the process chambers.

7. The substrate processing apparatus of claim 1, wherein the material comprising:
    at least molybdenum (Mo) and cobalt (Co) and excluding aluminum (Al) further comprises tungsten (W) and further excludes copper (Cu).

* * * * *